(12) United States Patent
Sugiyama et al.

(10) Patent No.: US 6,384,441 B1
(45) Date of Patent: May 7, 2002

(54) SEMICONDUCTOR DEVICE AND METHOD OF MANUFACTURING THE SAME

(75) Inventors: Koichi Sugiyama; Yukio Hosoda; Shinichiroh Ikemasu, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/730,761

(22) Filed: Dec. 7, 2000

(30) Foreign Application Priority Data

Mar. 31, 2000 (JP) ........................................ 2000-100127

(51) Int. Cl.⁷ ..................... H01L 27/108; H01L 23/532; H01L 29/41
(52) U.S. Cl. .......................... 257/296; 257/300; 257/774
(58) Field of Search ............................... 257/296, 300, 257/306, 774

(56) References Cited

U.S. PATENT DOCUMENTS

| | | | |
|---|---|---|---|
| 5,693,970 A | * 12/1997 | Ikemasu | 257/306 |
| 5,825,059 A | * 10/1998 | Kuroda | 257/301 |
| 6,072,241 A | 6/2000 | Kojima | 257/752 |
| 6,200,855 B1 | * 3/2001 | Lee | 438/255 |
| 6,255,151 B1 | * 7/2001 | Fukuda et al. | 257/296 |

FOREIGN PATENT DOCUMENTS

| | | | | |
|---|---|---|---|---|
| JP | 2-219264 A | * | 8/1990 | ................. 257/306 |
| JP | 9-205185 | | 8/1997 | |
| JP | 10-79491 | | 3/1998 | |
| JP | 11-87653 | | 3/1999 | |

* cited by examiner

Primary Examiner—Allan R. Wilson
(74) Attorney, Agent, or Firm—Armstrong, Westerman & Hattori, LLP

(57) ABSTRACT

There are contained the steps of leaving selectively the first insulating film that covers respective gate electrodes in the first region and the second region and the semiconductor substrate on side surfaces of the second gate electrode by etching back the first insulating film only in the second region, forming the second insulating film that is formed of same material as the first insulating film in the first region and the second region, forming the third insulating film whose selective etching to the first insulating film can be performed, forming holes to expose the semiconductor substrate by etching the first to third insulating films between the gate electrode in the first region, forming plugs in the holes, forming the fourth insulating film to cover the plugs and the third insulating film, forming a plurality of holes in the first region and the second region by patterning the fourth insulating film to the second insulating film.

13 Claims, 31 Drawing Sheets

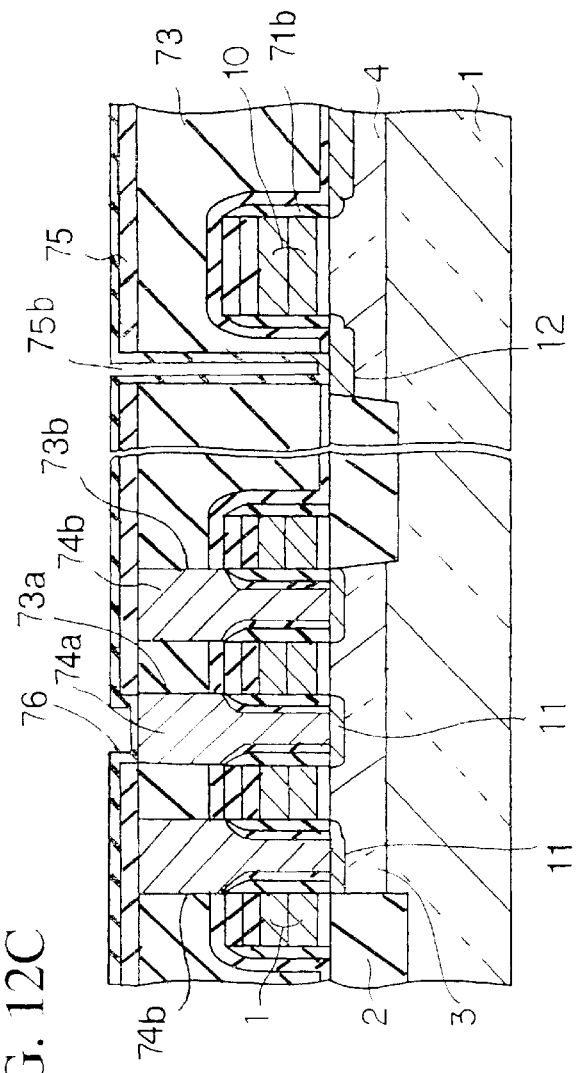
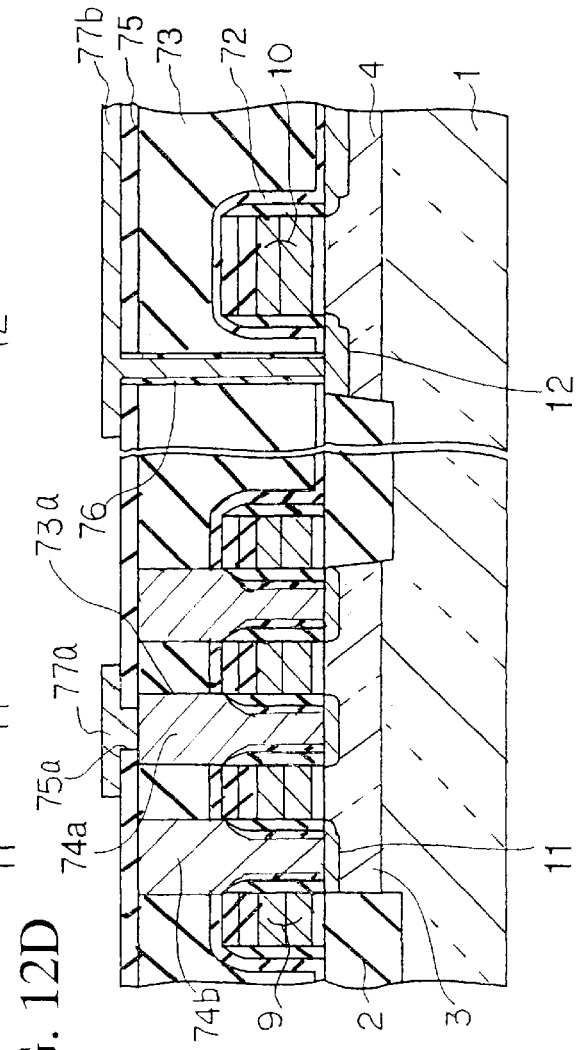

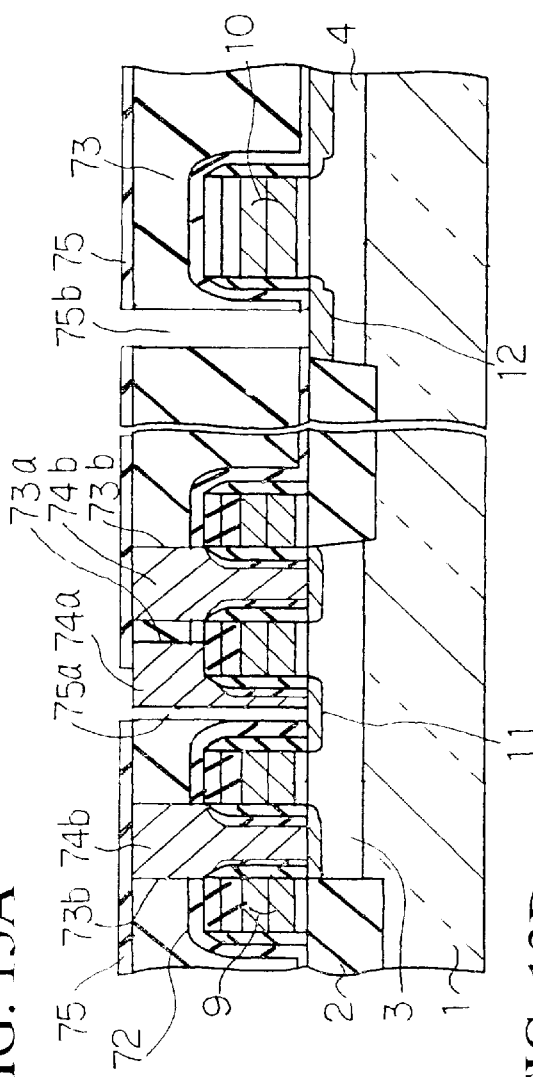
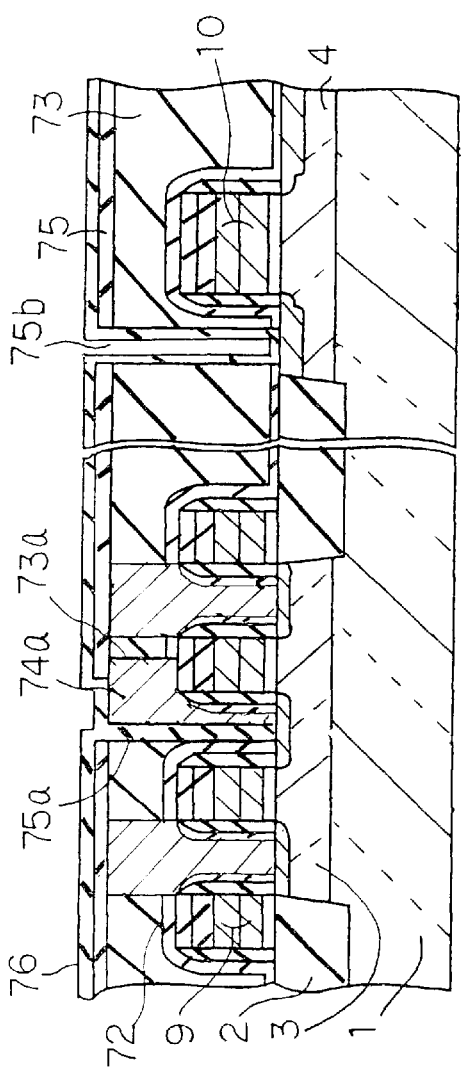

SEMICONDUCTOR DEVICE AND METHOD OF MANUFACTURING THE SAME

BACKGROUND OF THE INVENTION

1. Field of the Invention

The present invention relates to a semiconductor device and to a method of manufacturing the same and, more particularly, to a semiconductor device having a self-align contact structure used in DRAM, etc. and to a method of manufacturing the same.

2. Description of the Prior Art

An element area in the semiconductor device is required to reduce, as the integration of the semiconductor device becomes higher. However, under the prior art, an alignment precision in the photolithography cannot be so improved as the requirement of the size reduction of the semiconductor device.

Thus, various techniques have been taken with the miniaturization of the semiconductor device. For example, the self-align contact used in the highly integrated semiconductor memory device such as DRAM (dynamic random access memory) is adopted.

In the self-align contact, the silicon nitride film is formed on the side faces of the gate electrode as the sidewall spacer. The self-align contact that is constructed by forming the sidewall spacer made of silicon nitride on the side faces of the gate electrode of the MOS transistor will be explained hereunder.

First, a manufacturing method of the structure shown in FIG. 1A will now be explained.

The active regions in the memory cell region 102 and the peripheral circuit region 103 on the silicon substrate 101 respectively are isolated by an isolation insulating film 104. Then, the wells 105, 106 are formed by implanting the impurity ion into predetermined active regions of the silicon substrate 101 and by using a mask.

Next, the gate insulating films 107 are formed in the active regions by the thermal oxidation method, and then a silicon film and a protection insulating film are formed sequentially by the chemical vapor deposition (CVD) method. Then, gate electrodes 108a, 108b are formed in the memory cell region 102 and the peripheral circuit region 103 by patterning a silicon film and a protection insulating film by virtue of the photolithography method. In this case, the gate electrodes 108a are formed in one active region in the memory cell region 102 at the predetermined interval.

In this case, upper surfaces of the gate electrodes 108a, 108b are covered with the protection insulating film 109.

Next, steps to get the state shown in FIG. 1B will now be explained.

First, low impurity concentration portions of the impurity diffusion layers 110a, 110b are formed on both sides of the gate electrodes 108a, 108b on the silicon substrate 101 by ion-implanting the impurity into the active regions while using the gate electrodes 108a, 108b and the isolation insulating film 104 as a mask.

Then, a silicon nitride film for covering the gate electrodes 108a, 108b and the isolation insulating film 104 is formed on the silicon substrate 101. Then, the silicon nitride film is left on both sides of the gate electrodes 108a, 108b as the sidewall spacers 11a, 111b by etching-back the silicon nitride film.

Then, high impurity concentration portions of the impurity diffusion layers 110a, 110b are formed by ion-implanting the impurity into the active regions while using the gate electrodes 108a, 108b and the sidewall spacers 111a, 111b as a mask.

Next, as shown in FIG. 1C, the first insulating film 112 and the second insulating film 113 for covering the gate electrodes 108a, 108b are formed in sequence. The silicon nitride film is formed as the first insulating film 112, and the silicon oxide film containing the impurity, e.g., BPSG (Boro-Phospho Silicate Glass) is formed as the second insulating film 113. The reason for forming the silicon nitride film under the BPSG is to prevent the diffusion of the impurity in BPSG into the silicon substrate 101. The second insulating film 113 is heated to reflow and planarize its upper surface.

Then, as shown in FIG. 1D, the contact holes 113a to 113c are formed on the impurity diffusion layers 110a existing in the memory cell region 102 by patterning the first insulating film 112 and the second insulating film 113 by using the photolithography method. In this case, the second insulating film 113 in the memory cell region 102 is etched by the hydrofluoric acid, and the first insulating film 112 acts as an etching stopper. Also, the first insulating film 112 is etched by the phosphoric acid to expose the underlying impurity diffusion layer 110b.

The widths of these contact holes 113a to 113c are decided by intervals between the sidewall spacers 111a.

In this case, in one memory cell region 102, the contact hole 113a formed in the center is used to connect the bit lines, and other two contact holes 113b, 113c are used to connect the capacitors.

Next, as shown in FIG. 1E, silicon plugs 114a to 114c are filled into the contact holes 113a to 113c. Then, the third insulating film 115 made of silicon oxide is formed on the second insulating film 113 and the plugs 114a to 114c. Then, the opening 116 is formed on the contact hole 113a for bit-line connection by patterning the third insulating film 115 by virtue of the photolithography method, and at the same time the contact hole 117 is formed on the impurity diffusion layer 110b by patterning the third insulating film 115 and the second insulating film 113 in the peripheral circuit region 103 by virtue of the photolithography method.

In forming the contact hole 117, control of the depths of the opening 116 and the contact hole 117 can be facilitated since the first insulating film 112 and the plug 114a function as the etching stopper. Therefore, in order to expose the impurity diffusion layer 110b from the contact hole 117, the first insulating film 112 must be etched via the contact hole 117.

Here, the I—I sectional shape in FIG. 1E is shown in FIG. 3A.

After this, as shown in FIG. 1F, the metal film is formed on the third insulating film 115. Then, if this metal film is patterned, the bit line 118 connected to the plug 114a under the opening 116 is formed in the memory cell region 102 and also the wiring 119 connected to the impurity diffusion layer 110b via the contact hole 117 is formed in the peripheral circuit region 103.

Then, although not shown particularly, the steps of forming a capacitor (not shown) on the memory cell region 102 will be carried out.

Other wirings of the gate electrode are formed in the peripheral circuit region 103. In this case, in order to connect the wirings and the overlying wiring, the structure shown in FIG. 4 is adopted.

Next, the steps of forming the structure shown in FIG. 4 will be explained.

First, the device isolation insulating film 132 is formed on the surface of the silicon substrate 131. Then, a plurality of gate electrodes 134, 135 are formed in the memory cell region 102 and the peripheral circuit region 103 via the gate oxide film 133 respectively. At the same time, the first layer wiring 136 passing through over the device isolation insulating film 132 is formed in the peripheral circuit region 103.

These gate electrodes 134, 135 and the first layer wiring 136 have a double-layered structure that consists of a polysilicon film and a tungsten silicide film respectively. The protection insulating film 137 made of the silicon nitride film is formed thereon.

Then, the silicon nitride film is formed to cover the gate electrodes 134, 135, the first layer wiring 136, and the silicon substrate 131. Then, sidewall spacers 138a, 138b, 138c are left on both sides of the gate electrodes 134, 135 and the first layer wiring 136 respectively by etching-back the silicon nitride film. The first layer wiring 136 has the structure that is extended from the gate electrode 135 to the device isolation insulating film 132.

The impurity diffusion layers 139a, 139b serving as the source/drain are formed by introducing the impurity into the silicon substrate 131 before and after the sidewall spacers 138a, 138b, 138c are formed.

Then, the first interlayer insulating film 140 made of BPSG is formed on the protection insulating film 137, the semiconductor substrate 131, etc. The surface of the first interlayer insulating film 140 is planarized by heating to reflow or by the chemical mechanical polishing.

In the memory cell region 102, the contact holes 141a, 141b are formed for bit-line contact and storage contact, by etching a part of the first interlayer insulating film 140. These contact holes 141a, 141b are formed as the self-align contacts that are positioned between the gate electrodes 134 in a self-alignment fashion.

In addition, the plugs 142a, 142b made of silicon are formed in the contact holes 141a, 141b in the memory cell region 102. Then, the second interlayer insulating film 143 made of the silicon oxide film is formed on the plugs 142a, 142b and the first interlayer insulating film 140. Then, the hole 143a for bit-line connection is formed by etching the second interlayer insulating film 143 on the plug 142a for bit-line connection in the memory cell region 102. At the same time, the contact hole 144 is formed by etching the first interlayer insulating film 140 and the second interlayer insulating film 143 on the impurity diffusion layer 139b in the peripheral circuit region 103.

Thereafter, the bit line 145a passing through an inside of the hole 143a is formed in the memory cell region 102 and at the same time second layer wirings 145b, 145c are formed in the peripheral circuit region 103. A part of the pattern of the second layer wiring 145b is connected to the impurity diffusion layer 139b via the contact hole 144.

In this case, the bit line 145a and the second layer wiring 145b are formed of the metal film that has the triple-layered structure of Ti/TiN/W, for example.

Then, the third interlayer insulating film 146 made of the silicon oxide film or BPSG is formed, and then the surface of the third interlayer insulating film 146 is planarized by the chemical mechanical polishing.

Then, the capacitor is formed in the memory cell region 102. Here, the cylinder-shaped capacitor is illustrated as an example. The capacitor is formed along with following steps.

First, the storage contact hole 147a is opened by etching the second interlayer insulating film 143 and the third interlayer insulating film 146 formed on the storage contact plug 142b in the memory cell region 102, and then the plug 148 made of impurity containing silicon is formed in the hole 147a.

The fourth interlayer insulating film 147 made of the silicon nitride film is formed on the plug 148 and the third interlayer insulating film 146. Then, the patterning insulating film (not shown) made of the silicon oxide film or BPSG is formed on the fourth interlayer insulating film 147, and then the opening having the capacitor shape is formed by patterning the patterning insulating film and the fourth interlayer insulating film 147 by virtue of the photolithography method. Then, the polysilicon film is formed on the inner surface of the opening and on the patterning insulating film, and then the polysilicon film 150 on the patterning insulating film is removed by the chemical mechanical polishing. In this polishing, the photoresist may be filled into the concave portion formed by the polysilicon film in the opening of the patterning insulating film.

Accordingly, the polysilicon film being left like the cylinder in the opening of the patterning insulating film is used as the storage electrode 150 of the capacitor.

Then, the outer peripheral surface and the inner peripheral surface of the cylindrical storage electrode 150 are exposed by removing the patterning insulating film by using the hydrofluoric acid. According to difference in material, it is feasible to etch selectively the patterning insulating film with respect to the fourth interlayer insulating film 147.

Then, the dielectric film 151 made of tantalum oxide is formed on the surface of the storage electrode 150 by the chemical vapor deposition method, and then the opposing electrode 152 is formed on the dielectric film 151. The opposing electrode 152 is composed of the double-layered structure of titanium and polysilicon, for example. Accordingly, the capacitor 153 is completed.

After this, the fifth interlayer insulating film 149 as the silicon oxide film for covering the capacitor 153 is formed on the fourth interlayer insulating film 147, and then the surface of the fifth interlayer insulating film 149 is made flat by the chemical mechanical polishing.

Then, the via hole 154a is formed by etching the third to fifth interlayer insulating films 146, 147, 149 on the second layer wiring 145c in the peripheral circuit region 103 by means of the photolithography method. Also, the via hole 154b is formed by etching the first to fifth interlayer insulating films 140, 143, 146, 147, 149 and the protection insulating film 137 on the first layer wiring 145b in the peripheral circuit region 103. At this time, the holes are formed on the bit line 145a and the opposing electrode 152 respectively, but such holes are omitted from FIG. 4.

Then, the metal film having the triple-layered structure of Ti/TiN/W is formed in the via holes 154a, 154b and on the fifth interlayer insulating film 149. The metal film having the triple-layered structure being formed on the fifth interlayer insulating film 149 is removed by the chemical mechanical polishing method. Accordingly, the metal film having the triple-layered structure being left in the via holes 154a, 154b are used as the plugs 155a, 155b. At this time, the plugs are also formed in the holes (not shown) on the bit line 145a and the opposing electrode 152 in the memory cell region 102.

Thereafter, the third layer wirings 156, 157 made of an aluminum single layer or an aluminum containing non-stacked layer are formed on the fifth interlayer insulating film 149.

Here, the plugs 155a, 155b are electrically connected via the third layer wiring 156.

In this case, another third wiring 157 is formed in the memory cell region 102, and a part of the third wiring 157 is connected to the bit line 145a, the opposing electrode 512, etc. via the plugs (not shown).

The above steps are forming method of the memory cell and the peripheral circuit. FIG. 5A is a plan view showing arrangement relationship between the bit line 145a, the third layer wiring 157, etc. in the memory cell region 102. FIG. 5B is a plan view showing arrangement relationship between the wirings, etc. in the peripheral circuit region 103. The memory cell region 102 shown in FIG. 4 is a sectional shape that is viewed along a X—X line in FIG. 5A. The peripheral circuit region 103 shown in FIG. 4 is a sectional shape that is viewed along a XI—XI line in FIG. 5B.

By the way, based on the steps of forming the contact holes 113a to 113c shown in FIGS. 1A to 1F, there is such a possibility that the forming position of the contact hole 113a for bit-line connection is displaced and thus is separated from the sidewall spacer 111a on one side, as shown in FIG. 2A.

If the alignment displacement is caused in forming the contact hole 113a for bit-line connection and also the overlying opening 116 formed in the third insulating film 115 is formed at the normal position, the underlying first insulating film 112 is etched successively in forming the opening portion 116 in the second insulating film 113. Thus, as shown in FIG. 2B, the clearance 120 is formed on the side of the plug 114a to expose a part of the impurity diffusion layer 110a.

If the bit line 118 is formed on the third insulating film 115 under such state, such bit line 118 reaches the impurity diffusion layer 110a via the clearance 120, as shown in FIG. 2C. The II—II line sectional shape in FIG. 2C is shown in FIG. 3B.

Then, when the bit line 118 is connected to the impurity diffusion layer 110a, the bit-line constituting metal element enters into the impurity diffusion layer 110a in the later heating step to increase the leakage current from the impurity diffusion layer 110a, and therefore the charge storage of the capacitor is badly influenced. The slight leakage current from the impurity diffusion layer 110b does not become a serious issue in the peripheral circuit region 103.

On the contrary, the method of forming widely the upper surface region of the plug 114a may be considered as the countermeasure for the alignment displacement. In this case, another disadvantage such that the higher integration becomes difficult is caused. For the space between the plugs must be maintained at a predetermined interval to assure the breakdown voltage between the neighboring plugs and thus the increase in the upper surface region of the plug interferes with the higher integration of the semiconductor device.

Also, in the above method, only the identical widths can be selected in the memory cell region 102 and the peripheral circuit region 103 as the film thicknesses of the sidewall spacers 111a, 111b formed on both sides of the gate electrodes 108a, 108b. Therefore, the optimization of both the self-align contact breakdown voltage in the memory cell region and the widths of the sidewall spacers on the side surfaces of the gate electrode of the transistor in the peripheral circuit region cannot be achieved simultaneously. Thus, there is caused such a problem that the higher integration of the semiconductor device and the optimization of the driving characteristic of the transistor are not compatible.

In the meanwhile, in the semiconductor memory device shown in FIG. 4, the second layer wiring 145c and the first layer wiring 136 are connected to each other via the wiring 156 being formed on the fifth interlayer insulating film 149. The reason for this is given as follows.

First, in the step of forming the hole 143a to connect the bit line 145a and the underlying plug 142a in the memory cell region 102 and the contact hole 144 to connect the second layer wiring 145b and the impurity diffusion layer 139b in the peripheral circuit region 103, it is preferable that the contact hole to connect the first layer wiring 136 and the overlying second layer wiring 145c in the peripheral circuit region 103 should be formed simultaneously.

In case three type holes are opened simultaneously, the silicon nitride film acting as the protection insulating film 137 on the first layer wiring 136 must be etched.

However, when the hole 143a to connect the bit line 145a and the plug 142a is formed in the memory cell region 102, the displacement margin cannot be sufficiently assured because of the request of miniaturization. As a result, the forming position of the hole 143a protrudes from the plug 142a. Then, if the protection insulating film 137 is etched via the hole 143a that protrudes from the plug 142a, the breakdown voltage between the plug 142a and the gate electrode 134 is deteriorated. In the worst case, the short-circuit between the plug 142a and the gate electrode 134 is brought about.

Then, at the time of anisotropic etching of the second interlayer insulating film 143 in which the hole 143a is formed, such a condition is employed that the selective etching ratio of the second interlayer insulating film 143 to the protection insulating film 137 is consciously set high. As the anisotropic etching condition, the etching in the mixed gas atmosphere consisting of $C_4F_8$, $CHF_3$, Ar, $O_2$, etc., for example, may be considered.

Accordingly, if the hole 143a is displaced from the plug 142a, the protection insulating film 137 is hardly etched, so that the exposure of the gate electrode 134 from the hole 143a can be prevented.

According to the above reason, it is not applied to etch successively the first interlayer insulating film 140 and the protection insulating film 137, both are formed of different material. Assume that the hole to connect the second layer wiring 145c and the first layer wiring 136 is formed in the second interlayer insulating film 143, the first interlayer insulating film 140, and the protection insulating film 137 in the peripheral circuit region 103, the step of forming the resist mask that is used to etch only the protection insulating film 137 on the first layer wiring 136 is needed after the etching of the first interlayer insulating film 140 is finished. Thus, it is impossible to avoid the complication of the steps.

In contrast, when the holes are formed in the fifth interlayer insulating film 149 and the underlying interlayer insulating films, there is no possibility that the protection insulating film 137 in the memory cell region 102 since the formation of the holes 143a, 147a connected to the plugs 141a, 141b in the memory cell region 102 has already been finished. Therefore, after the etching of the first interlayer insulating film 140 is finished, the protection insulating film 137 on the first layer wiring 136 can be etched by changing the etching conditions, without the change of the mask.

According to the above, the structure that the first layer wiring 136 and the second layer wiring 145c are electrically connected to each other via the wiring 156 formed on the fifth interlayer insulating film 149 and the holes 154a, 154b is employed.

However, if such structure is employed, the connecting portions between the first layer wiring 136 and the second layer wiring 145c must be formed separately and also the wiring 156 to connect these wirings 136, 145c must be formed. Therefore, there is the problem such that the chip area is increased at this time.

SUMMARY OF THE INVENTION

It is an object of the present invention to provide a semiconductor device capable of suppressing increase in a leakage current from impurity diffusion layers connected to plugs even if mutual positions of the plugs and bit-line opening portions are displaced in the process by which a window connected to a bit line in the memory cell region and windows connected to source/drain impurity diffusion layers of a transistor in the peripheral circuit region are opened simultaneously, in the case that metal material is used as the bit line, and also capable of assuring optimum widths of sidewall spacers on side surfaces of gate electrodes in a memory cell region and a peripheral circuit region respectively, and a method of manufacturing the same.

Also, it is another object of the present invention to provide a semiconductor device capable of connecting multi-layered wirings by a small number of steps, and a method of manufacturing the same.

Accordingly, if the first holes are formed to displace to the gate electrode on one side in the first region and also the second hole being formed simultaneously with the third hole is formed to protrude from the first holes, the semiconductor substrate is never exposed from the second hole because of the presence of the first insulating film. Therefore, even if the metal film is formed in the second hole, the connection between the metal film and the impurity diffusion layer on the semiconductor substrate can be prevented in the first region.

In addition, the first insulating film is formed to have an optimum thickness to form the spacers on the side surfaces of the gate electrodes in the second region, and thus the total film thickness of the first and second insulating films can be selected to give the optimum thickness as the spacers on the side surfaces of the gate electrodes in the first region.

Accordingly, the optimization of the film thickness of the spacers on the side surfaces of the gate electrodes can be selected every region.

Also, according to the above invention, in the case that the first holes that are formed in the insulating film between the gate electrodes in the first region are formed to deviate to the gate electrodes on one side and the plugs are formed in the first holes and also the second hole that is formed in the overlying insulating film covering the plugs is displaced from the plugs and has a depth reaching the impurity diffusion layer on the semiconductor substrate, the burying insulating film is formed selectively on the portions being projected from the plugs in the second hole.

Accordingly, the metal film formed in the second hole is never connected to the impurity diffusion layer because of the burying insulating film.

Accordingly, the holes can be simultaneously formed on the plugs in the first region and on the gate electrodes and the first layer wiring in the second region respectively without change of the etchant by patterning the second insulating film and the third insulating films. Therefore, throughput of the hole formation can be improved.

BRIEF DESCRIPTION OF THE DRAWINGS

FIGS. 12A to 12D are sectional views showing manufacturing steps of a semiconductor device according to a second embodiment of the present invention;

FIGS. 13A to 13C are another sectional views showing the manufacturing steps of the semiconductor device according to the second embodiment of the present invention.

DETAILED DESCRIPTION OF THE PREFERRED EMBODIMENTS

Figure 1A:
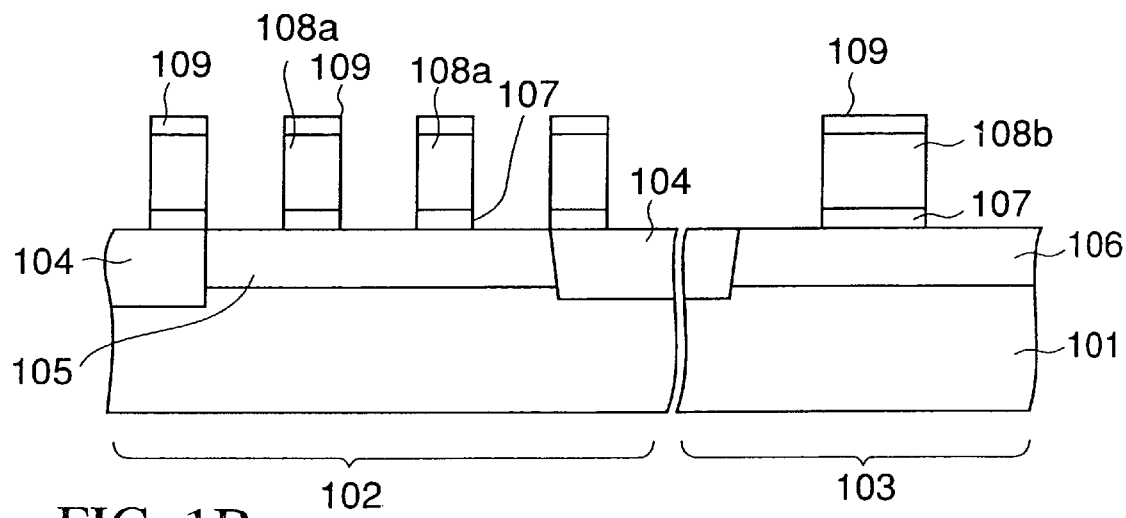
FIGS. 1A to 1F are sectional views showing a manufacturing steps of a semiconductor device according to a first prior art.
Figure 1B:
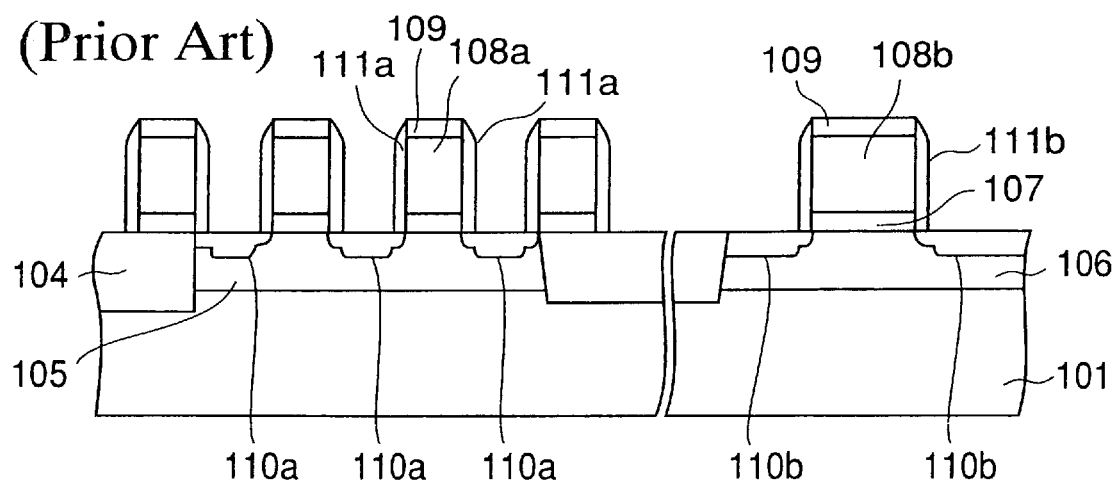
Figure 1C:
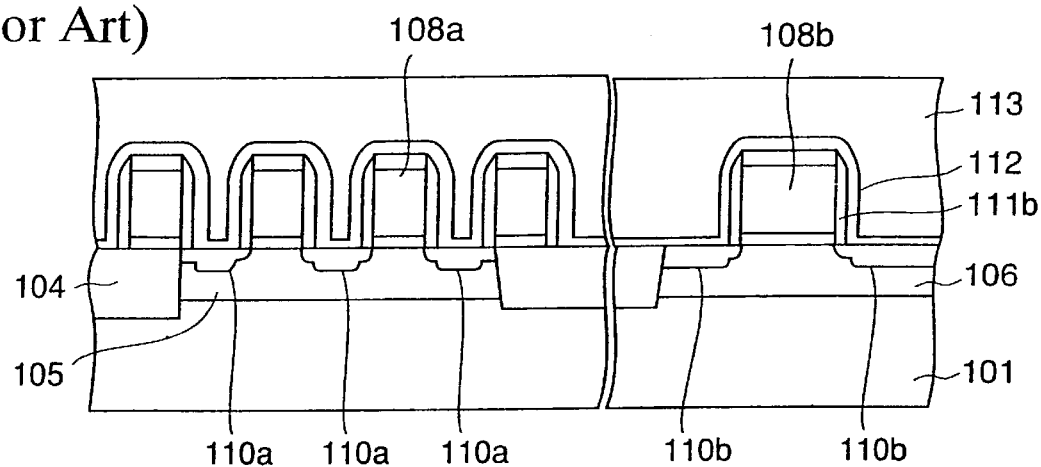
Figure 1D:
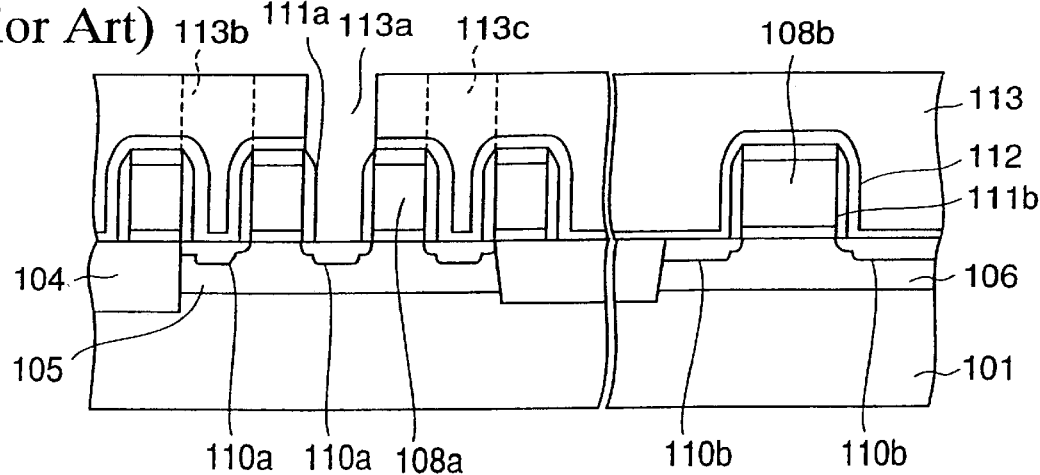

Embodiments of the present invention will now be explained in detail with reference to the accompanying drawings.

First Embodiment

FIGS. 6A to 6M are sectional views showing semiconductor device manufacturing steps according to a first embodiment of the present invention.

First, steps required to get the structure shown in FIG. 6A will be explained hereunder.

At least a memory cell region A and a peripheral circuit region B are present on an n-type silicon substrate (semiconductor substrate) 1. A device isolation insulating film 2 having a shallow trench isolation (STI) structure is formed in these regions A, B on the silicon substrate 1. In this case, other device isolation methods may be employed in place of STI.

After such device isolation insulating film 2 is formed, p-wells (active regions) 3, 4 are formed by implanting ions into predetermined active regions in the memory cell region A and the peripheral circuit region B. The well structure is formed by the well-known method and thus its details are omitted herein. Although the p-well 4 is formed in the peripheral circuit region B in FIG. 6A, there exits an active region into which no impurity is injected.

Then, a gate oxide film 5 is formed on a surface of the active region by thermally oxidizing the surface of the active region of the silicon substrate 1.

Then, a silicon layer 6 and a silicide layer 7 are formed in sequence on the gate oxide film 5, and then a protection insulating film 8 is formed on the silicide layer 7. The protection insulating film 8 is constructed by forming sequentially an SiON film 8a of 50 nm thickness, that acts as a reflection preventing film, and a silicon nitride film 8b of 150 nm thickness, that acts as SAC (Self-Align Contact) described later, by the chemical vapor deposition method.

After this, the protection insulating film 8, the silicide layer 7, and the silicon layer 6 are patterned into gate electrode shapes by the photolithography method using the resist. Accordingly, a plurality of gate electrodes 9 each consists of the silicon layer 6 and the silicide layer 7 and is used commonly as a word line are formed in the memory cell region A, and a plurality of gate electrodes 10 each consists of the silicon layer 6 and the silicide layer 7 are formed in the peripheral circuit region B.

Then, while using a resist mask (not shown) in which the memory cell region A is opened, n-type impurity diffusion layers 11 are formed on both sides of the gate electrodes 9 by implanting n-type impurity ions selectively into the memory cell region A of the silicon substrate 1. In the memory cell region A, basic MOS transistors T1 are composed of the n-type impurity diffusion layer 11 and the gate electrode 9 respectively. Then, while using a resist mask (not shown) in which the peripheral circuit region B is opened, low concentration portions of impurity diffusion layers 12 are formed on both sides of the gate electrodes 10 by implanting impurity ions selectively into the peripheral circuit region B of the silicon substrate 1.

After the resist mask is removed, an oxide film (not shown) of 5 nm thickness is formed by oxidizing surfaces of the impurity diffusion layers 11, 12 at 800° C. in a dry oxygen atmosphere by means of the thermal oxidation method, for example.

Figure 6A:
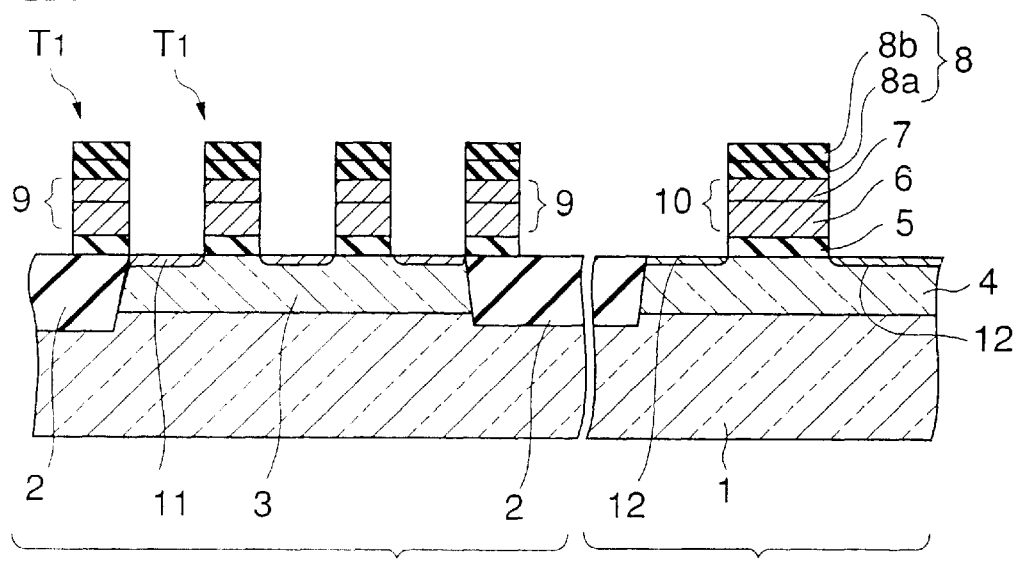
FIGS. 6A to 6M are sectional views showing a manufacturing steps of a semiconductor device according to a first embodiment of the present invention.
Figure 6B:
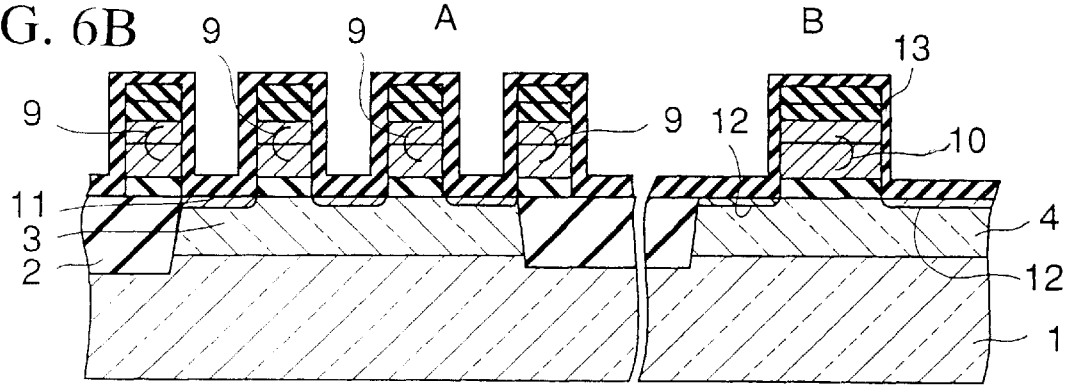

Next, as shown in FIG. 6B, a first silicon nitride film (first insulating film) 13 is formed on upper and side surfaces of the gate electrodes 9, 10 and on the silicon substrate 1 by the chemical vapor deposition method using a silane ($SiH_4$) gas and an ammonia ($NH_3$) gas to have a film thickness of 20 to 100 nm, preferably 30 to 60 nm. In this case, the film thickness of at least 30 to 40 nm is needed to be left as sidewalls formed on side walls of the gate electrodes 10 in the peripheral circuit region B in the succeeding step.

Figure 6C:
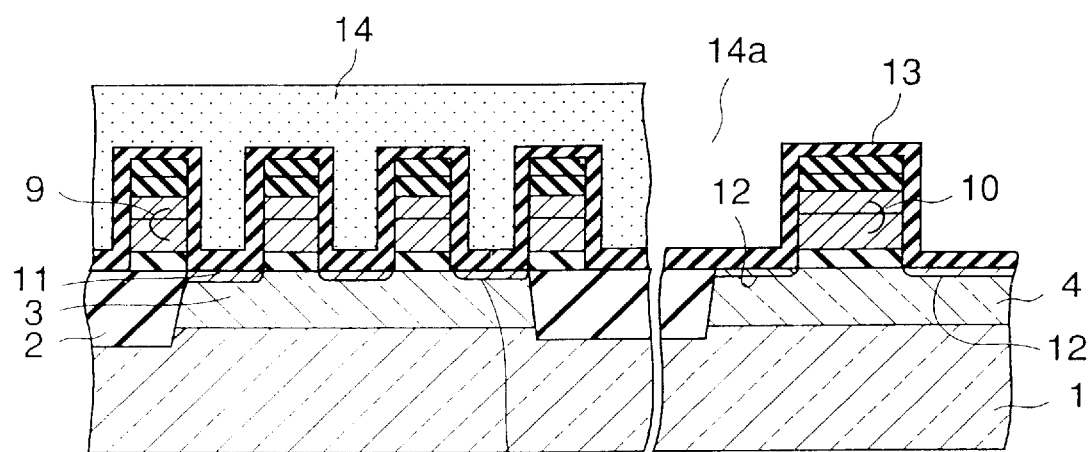

Then, as shown in FIG. 6C, an opening 14a is formed by coating photoresist 14 on the first silicon nitride film 13 and then exposing/developing the photoresist 14 to expose the peripheral circuit region B. Then, the first silicon nitride film 13 in the peripheral circuit region B is etched in the substantially perpendicular direction to the substrate surface via the opening 14a by virtue of the anisotropic etching. The etching is performed by using a mixed gas of $CHF_3$, Ar and $O_2$, for example, as a gas seed of the etching and using actively an end point. Sometimes, $CF_4$ is used in lieu of $CHF_3$.

Figure 6D:
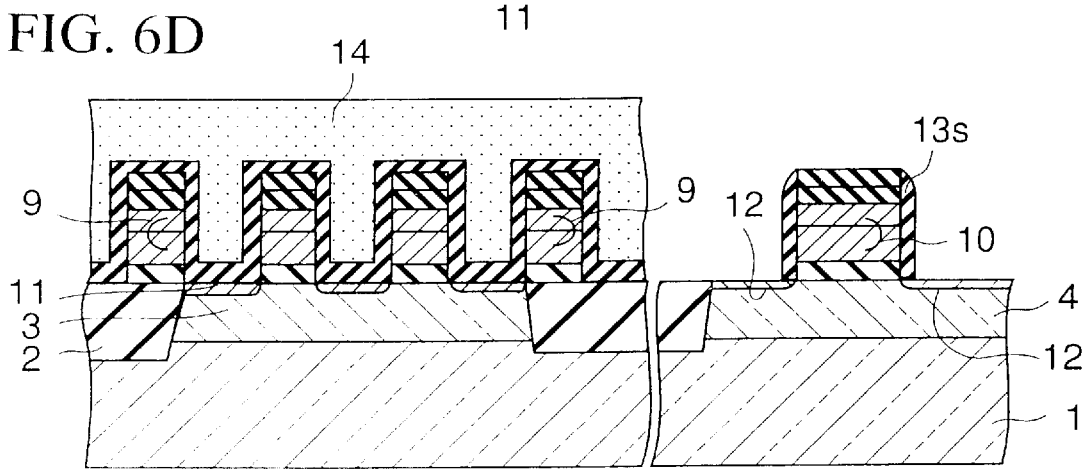

Accordingly, as shown in FIG. 6D, the first silicon nitride film 13 is left as sidewall spacers 13s on both side surfaces of the gate electrodes 10 in the peripheral circuit region B, whereas the silicon substrate 1 between the gate electrodes 9 is still covered with the first silicon nitride film 13 in the memory cell region A.

Then, the photoresist 14 is removed, and then a silicon oxide film (not shown) of 5 nm thickness is formed on the surface of the silicon substrate 1 in the peripheral circuit region B by the thermal oxidation method. As the condition of the thermal oxidation method, the substrate temperature of 800° C. is set in the dry oxygen atmosphere, for example.

Then, the impurity is ion-implanted into the silicon substrate 1 in the peripheral circuit region B by using the gate electrodes 10 and the sidewall spacers 13s in the peripheral circuit region B as a mask. Accordingly, high concentration portions are formed in the impurity diffusion layers 12 on the side of the gate electrodes 10 in the peripheral circuit region B, whereby each of the impurity diffusion layers 12 has an LDD structure. As a result, basic structures of the MOS transistors $T_2$ can be completed in the peripheral circuit region B.

In this case, the resist mask is used on the peripheral circuit region B to introduce the p-type impurity and the n-type impurity into desired regions respectively. Also, the memory cell region A is covered with the resist mask when any impurity is implanted.

Accordingly, in the memory cell region A, the high concentration impurity ion implantation is not performed but only the low concentration impurity diffusion layer 11 is formed. This intends to prevent the increase in the leakage current by preventing the faults that generated in the impurity diffusion layer 11 in the memory cell region A by the ion implantation.

After the ion implantation in the peripheral circuit region B is finished, the annealing may be additionally applied. This intends to activate the ion-implanted region and reduce the crystal defects generated by the high concentration ion implantation.

Figure 6E:
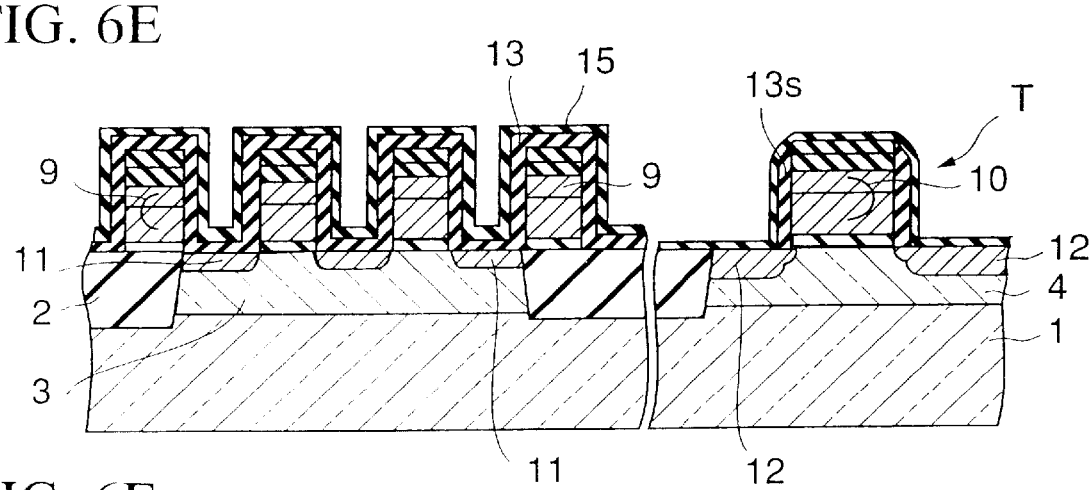

Then, as shown in FIG. 6E, a second silicon nitride film (second insulating film) 15 is grown by virtue of the chemical vapor deposition method using the $SiH_4$ gas and the $NH_3$ gas to have a film thickness of 2 to 100 nm, preferably 10 to 30 mm, such that the second silicon nitride film 15 is formed to overlap with the first silicon nitride film 13. Thus, the sidewall spacers 13s and the impurity diffusion layers 12 is covered with the second silicon nitride film 15 in the peripheral circuit region B.

The second silicon nitride film 15 is formed to improve the SAC breakdown voltage, to be described later, in the memory cell region A and to prevent the diffusion of the impurity in the interlayer insulating film, that is formed by later steps, into the silicon substrate 1.

In order to improve the SAC breakdown voltage by the second silicon nitride film 15, it is preferable to increase the film thickness of the second silicon nitride film 15. In this case, the film thickness must be selected not to bury the spaces between the gate electrodes 9, 10 in the peripheral circuit region B and the memory cell region A by the first and second silicon nitride films 13, 15.

Accordingly, the film thickness of the second silicon nitride film 15 is decided up to the maximum film thickness that does not bury the spaces between the gate electrodes 9. For example, if the minimum space between the gate electrodes 9 in the memory cell region A is 200 nm and the film thickness of the first silicon nitride film 13 is 50 nm, a remaining space between the gate electrodes 9 is 100 nm. Here, assume that fluctuation of the process occurs by 10%, the upper standard of the film thickness of the second silicon nitride film 15 is 45 nm, i.e., half of 90 nm. A total film thickness of the first and second silicon nitride films 13, 15 needs at least about 40 to 50 nm, but preferably the total film thickness should be set in excess of this thickness.

Figure 6F:
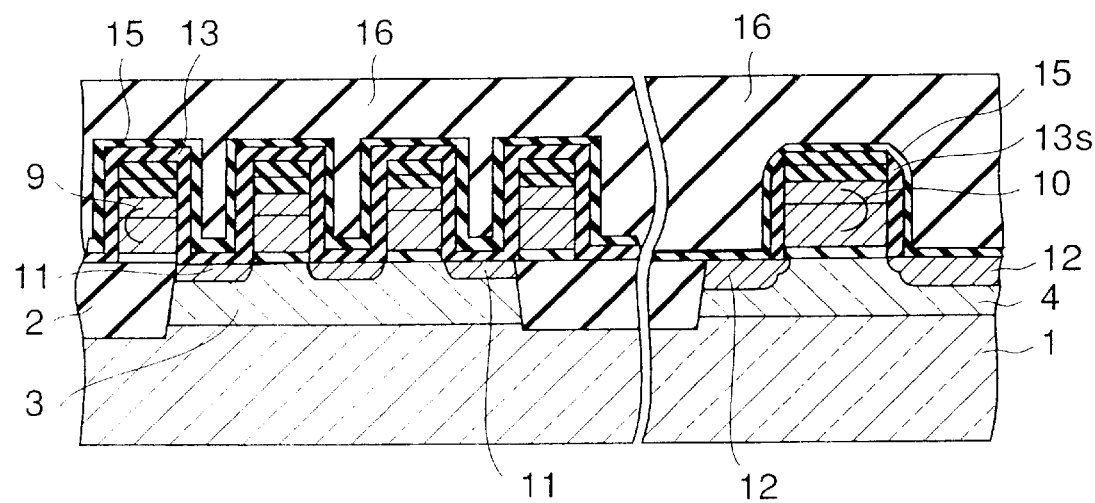

Next, steps required to get the structure shown in FIG. 6F will be explained hereunder.

First, a first interlayer insulating film (third insulating film) 16 of 1 μm thickness, for example, is formed on the second silicon nitride film 15 by using the chemical vapor deposition method. As the first interlayer insulating film 16, the insulating film such as BPSG, HDP oxide film, and others is used to bury the spaces between the gate electrodes. In the following description, the case where BPSG is used as the first interlayer insulating film 16 will be explained hereunder.

Then, an upper surface of the first interlayer insulating film 16 is planarized by heating the first interlayer insulating film 16 to reflow or by the chemical mechanical polishing (CMP).

Figure 6G:
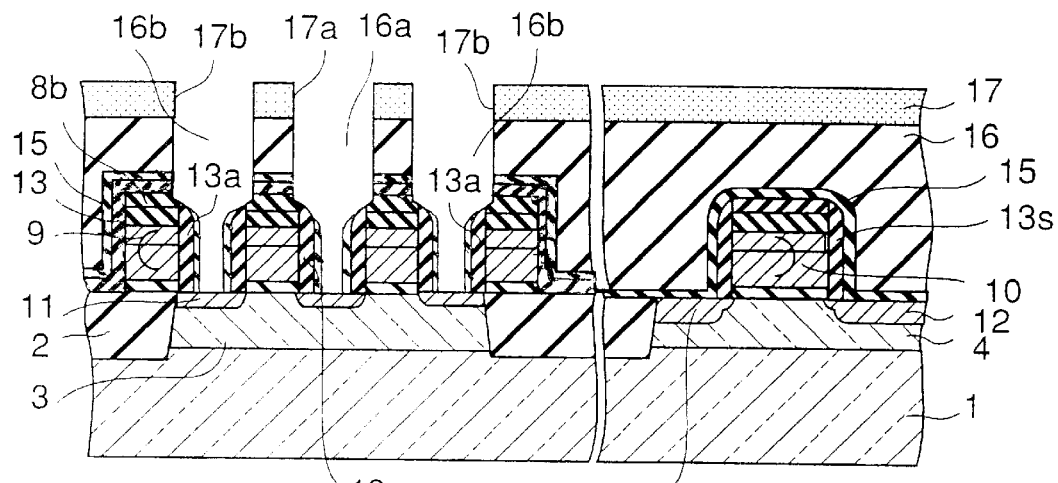

Then, as shown in FIG. 6G, a window 17a for bit-line contact and windows 17b for storage contact are opened in the region containing at least the memory cell region A by coating the photoresist on the first interlayer insulating film 16 and exposing/developing it. These windows 17a, 17b are formed at least over regions between the gate electrodes 9 in the memory cell region A.

Then, a bit-line contact hole 16a and storage contact holes 16b are formed in the first interlayer insulating film 16 by etching this first interlayer insulating film 16 via the windows 17a, 17b by means of the unisotropic etching. In this etching, the condition is set such that the second silicon nitride film 15 below the first interlayer insulating film 16 can still remain, even in a small amount, by using a mixed gas of $C_4F_8$ and $CH_2F_2$, for example. In subsequence, the first and second silicon nitride films 13, 15 appeared under the bit-line contact hole 16a and the storage contact holes 16b are etched by using a gas system containing $CHF_3$, for example, whereby the bit-line contact hole 16a and the storage contact holes 16b have a depth to reach the substrate surface. In this case, the etching condition is set such that at least the first silicon nitride film 13 can be left on the side walls of the gate electrodes 9 as the sidewall spacers 13a. In some cases the silicon nitride film 8b on the gate electrodes 9 is also etched, but the SiON film 8a formed under the silicon nitride film 8b is never exposed since the thickness of the silicon nitride film 8b is previously adjusted.

As described above, even when the contact holes 16a, 16b are formed in the positions to project onto the gate electrodes 9 because of the positional displacement of the windows 17a, 17b in the resist 17, etc., the situation that these contact holes 16a, 16b come into direct contact with the gate electrodes 9 can be avoided if the etching of the first interlayer insulating film 16 is set to have the selective ratio to the first and second silicon nitride films 13, 15. Such technology is called SAC (Self-Align Contact). In order to form the SAC with good yield, it is preferable that the total film thickness of the first and second silicon nitride films 13, 15 should be formed thicker. However, if the first silicon nitride film 13 is formed too thick, the width of the sidewall spacers 13s formed on the side surfaces of the gate electrodes 10 of the MOS transistors $T_2$ in the peripheral circuit region B is increased. Therefore, the reduction in the transistor performances such as the current driving capability is caused, or the spaces between the gate electrodes 9 in the memory cell region A are perfectly buried by the first silicon nitride film 13, and thus the excessively thick total film thickness is not preferable.

In such case, in the first embodiment, since the thickness of the first silicon nitride film 13 is reduced but the thickness of the second silicon nitride film 15 is increased, the width of the sidewall spacers 13s can be made small in the peripheral circuit region B and also the spaces between the gate electrodes 9 can be assured in the memory cell region A. In other words, the current driving capability of the MOS transistors $T_2$ in the peripheral circuit region B can be increased, while improving the yield of SAC, by adjusting the total film thicknesses of the first silicon nitride film 13 and the second silicon nitride film 15 respectively.

In this manner, since the first and second silicon nitride films 13, 15 are formed as the double-layered structure, the first silicon nitride film 13 can have the optimum film thickness as the sidewall spacers 13b in the peripheral circuit region B, and also the total film thickness of the first and second silicon nitride films 13, 15 can be set to the optimum film thickness to improve the yield of SAC. Therefore, there is such an advantage that the film thickness can be optimized in each of the regions A and B.

Then, a contact resistance between plugs, formed in the succeeding step, and the impurity diffusion layers 11 is lowered by ion-implanting the impurity into the impurity diffusion layers 11 via the contact holes 16a, 16b. As the impurity ion implanting condition for such contact compensation, an acceleration energy of 30 keV and a dosage of $1\times10^{13}$ $cm^{-2}$ of the phosphorus ion, for example, are set.

After the photoresist 17 on the first interlayer insulating film 16 is peeled off, an amorphous silicon film into which the phosphorus is doped is formed on the first interlayer insulating film 16 and in the contact holes 16a, 16b in the memory cell region A. Then, the amorphous silicon film formed on the first interlayer insulating film 16 is removed by the CMP method.

Figure 6H:
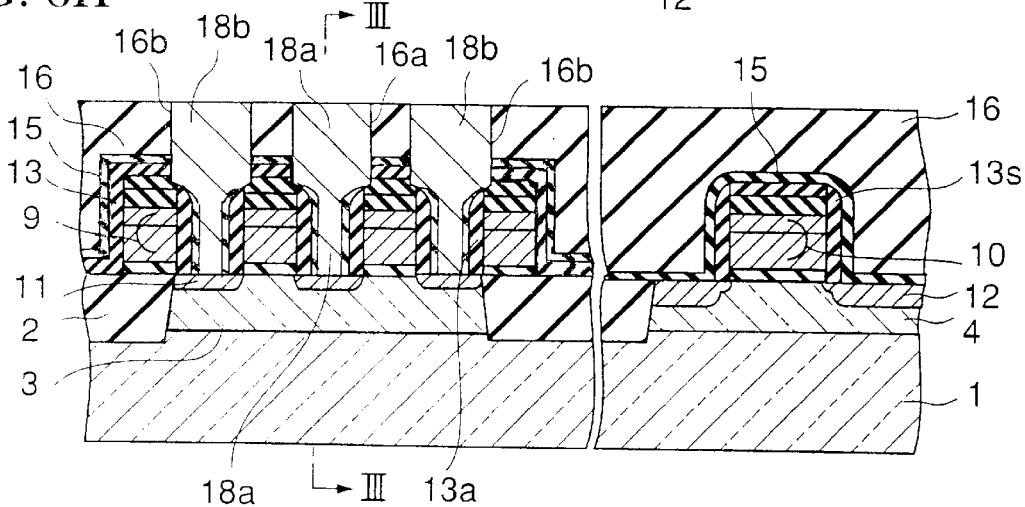

Accordingly, as shown in FIG. 6H, the amorphous silicon film remaining in the bit-line contact hole 16a is used as the bit-line contact plug 18a, and the amorphous silicon film remaining in the storage contact hole 16b is used as the storage contact plug 18b.

Figure 6I:
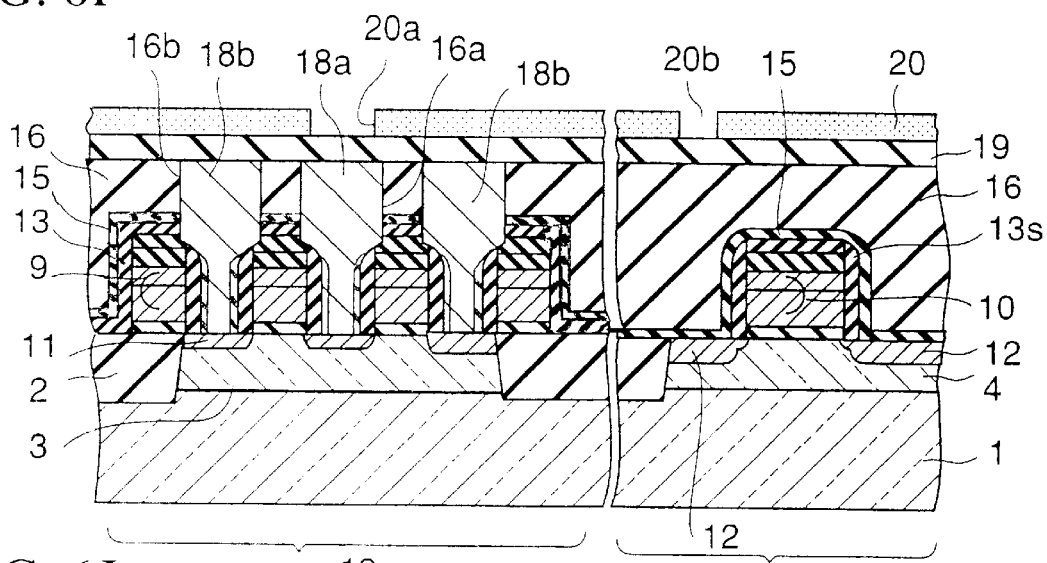

Then, as shown in FIG. 6I, a second interlayer insulating film (fourth insulating film) 19 is formed on the plugs 18a, 18b and the first interlayer insulating film 16. In order to assure the breakdown voltage between the bit line and plugs for the storage electrode of the capacitor, that are formed by later steps, it is preferable that the high temperature oxide film, for example, should be employed as the second interlayer insulating film 19.

Then, windows 20a, 20b are formed at least on the bit-line contact hole 16a in the memory cell region A and the impurity diffusion layers 12 serving as the source/drain of the MOS transistors T2 in the peripheral circuit region B respectively by coating photoresist 20 on the second interlayer insulating film 19 and then exposing/developing it.

Figure 6J:
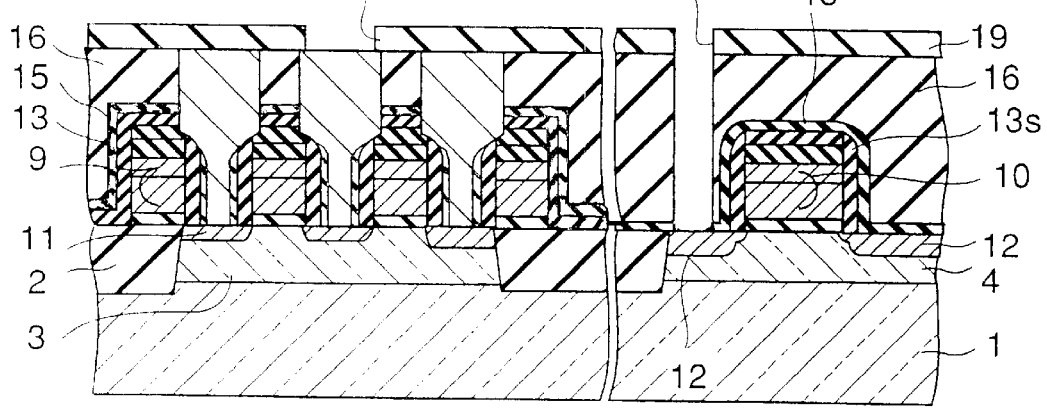

Then, as shown in FIG. 6J, a bit-line contact via hole 19a is formed in the memory cell region A and a contact hole 19b is formed in the peripheral circuit region B, by etching the second interlayer insulating film 19 via these windows 20a, 20b and then etching the first interlayer insulating film 16 subsequently.

Such etching is carried out under the condition that, while using a mixed gas of $C_4F_8$ and $CH_2F_2$, for example, these films can be etched selectively to the second silicon nitride film 15 in the peripheral circuit region B. In this case, the bit-line contact plug 18a and the second silicon nitride film 15 act as the etching stopper respectively.

In addition, the second silicon nitride film 15 is etched via the contact hole 19b in the peripheral circuit region B by using a gas system containing $CHF_3$ and $O_2$.

Figure 7A:
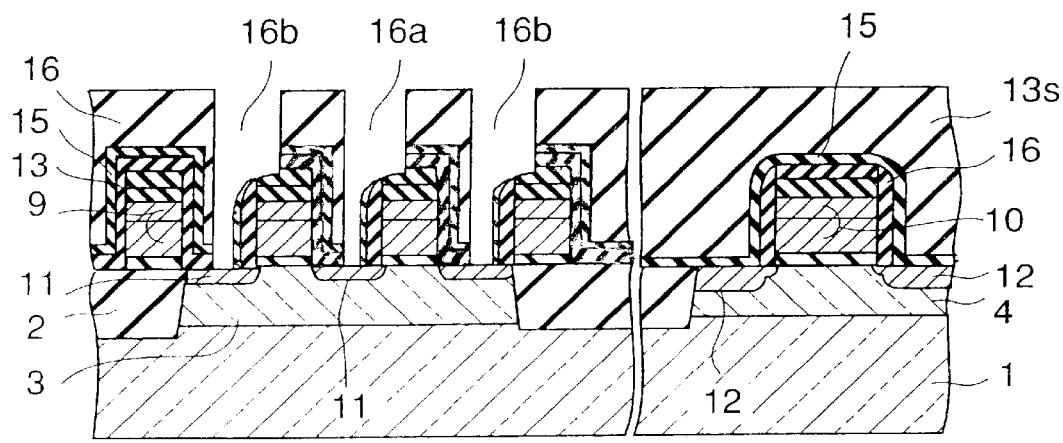
FIGS. 7A to 7D are sectional views showing the situation that displacement is caused between plugs but no displacement is caused between holes formed on the plugs, in the a manufacturing steps of a semiconductor device according to the first embodiment of the present invention.
Figure 7B:
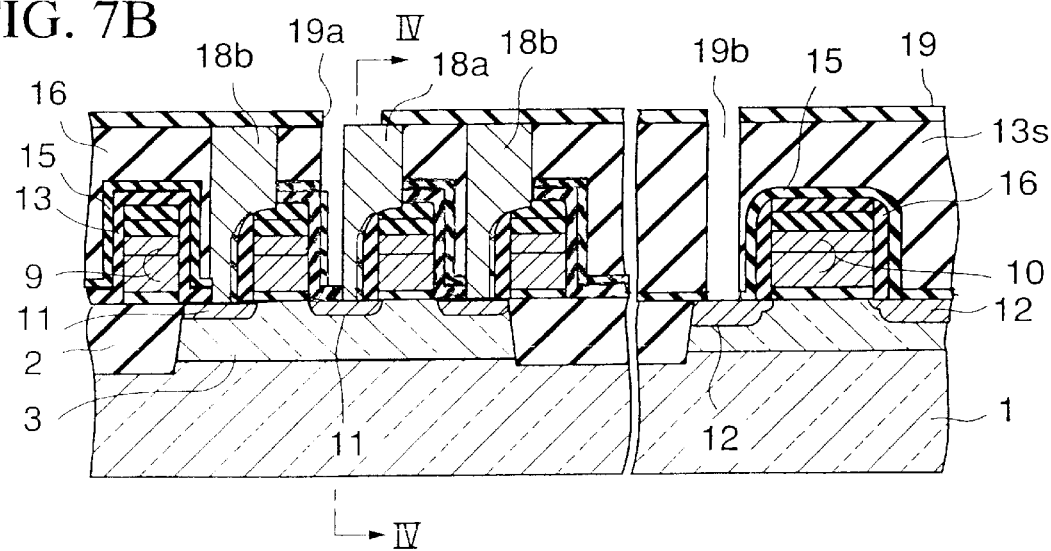

By the way, FIG. 6I shows the case where the bit-line contact hole 16a and the via hole 19a are formed at designed positions in the memory cell region A. In some cases, as shown in FIG. 7A, the contact hole 16a formed between two gate electrodes 9 is deviated and displaced to the gate electrode 9 on one side while, as shown in FIG. 7B, the via hole 19a is formed in the designed position. In this case, if the via hole 19a and the plug 16a are displaced relatively to expose the first interlayer insulating film 16 in the via hole 19a, the via hole 19a becomes deeper than the second interlayer insulating film 19.

However, since the total film thickness of the first and second silicon nitride films 13, 15 remaining in the memory cell region A is thicker than the film thickness of the second silicon nitride film 15 left in the peripheral circuit region B, it is ready to leave the first silicon nitride film 13 under the via hole 19a formed simultaneously in the memory cell region A after the second silicon nitride film 15 is etched via the contact hole 19b in the peripheral circuit region B. Thus, the silicon substrate 1 can be prevented from being exposed from the via hole 19a.

Accordingly, upon etching the second silicon nitride film 15 in the peripheral circuit region B, such a condition can be adopted that, if the etching is performed like the over-etching to some extent, the first silicon nitride film 13 immediately under the bit-line contact via hole 19a can be still left.

In this fashion, even if the first interlayer insulating film 16 and the second silicon nitride film 15 are etched in forming the via hole 19a, the surface of the silicon substrate 1 is covered with the first silicon nitride film 13 thereunder. Therefore, the bit-line metal film being filled into the via hole 19a does not contact to the silicon substrate 1.

Figure 8A:
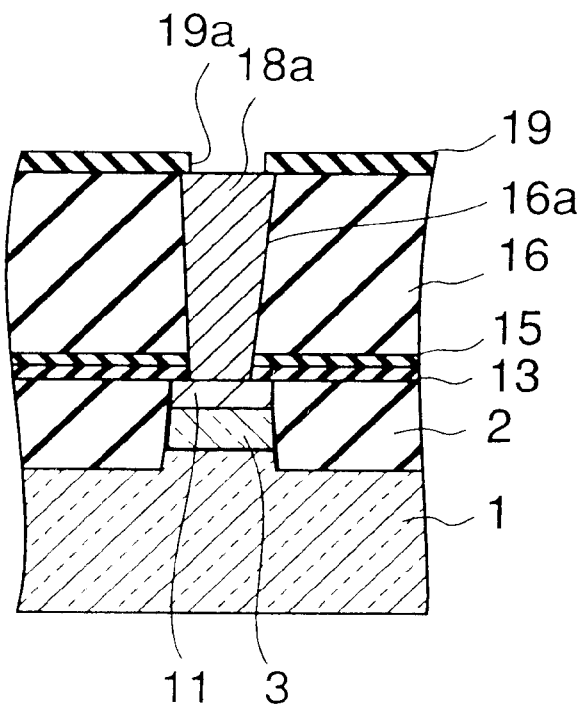
FIG. 8A is a sectional view showing a sectional shape of the semiconductor device, taken along a III—III line in FIG. 6H.
Figure 8B:
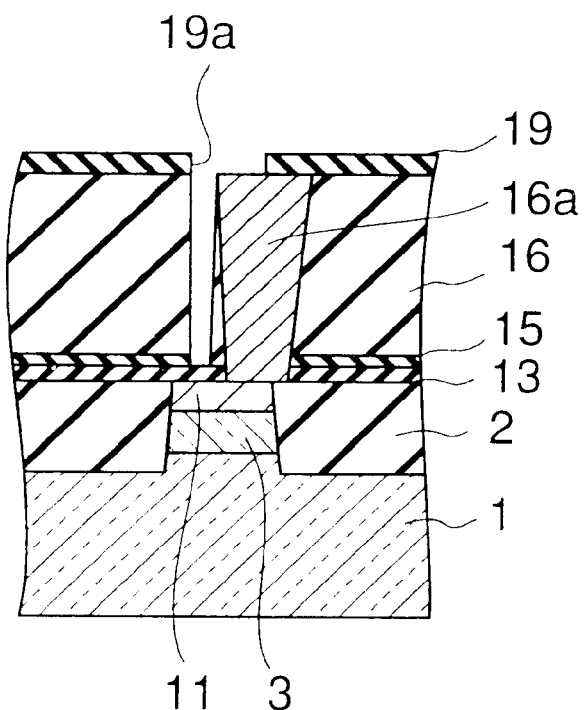
FIG. 8B is a sectional view showing a sectional shape of the semiconductor device, taken along a VI—VI line in FIG. 7B.

The III—III line sectional shape in FIG. 6H is given as shown in FIG. 8A, and the IV—IV line sectional shape in FIG. 7B is given as shown in FIG. 8B.

After the formation of the via hole 19a and the contact hole 19b is completed, the photoresist 20 is removed.

Figure 6K:
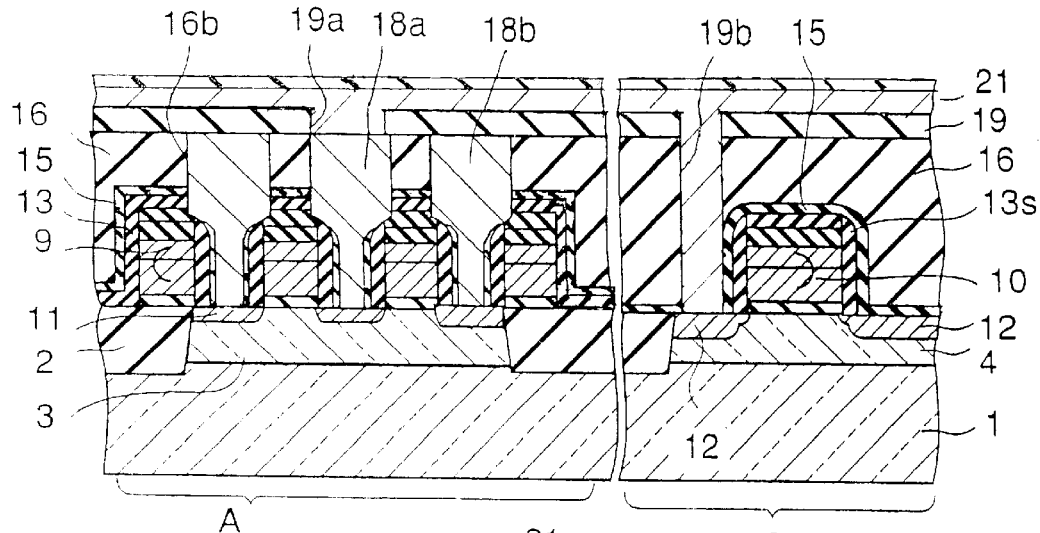

Then, as shown in FIG. 6K, a metal film 21 having the multi-layered structure and a thickness of 100 to 300 nm is formed in the bit-line contact via hole 19a in the memory cell region A and in the contact hole 19b in the peripheral circuit region B and on the second interlayer insulating film 19. The metal film 21 employs a structure in which Ti, TiN, W, for example, are formed in sequence from the bottom. Ti is formed by the sputter method, TiN is formed by the sputtering or the chemical vapor deposition method, and W is formed by the chemical vapor deposition method.

The contact between the interface between different type metals can be stabilized at annealing the metal film 21 at one timing of either during the formation of the metal film 21 having the multi-layered structure or after such formation, or at both timings of them.

After this, a reflection preventing film 22 formed of SiON is formed on the metal film 21 by the chemical vapor deposition method to have a thickness of 30 to 100 nm.

Figure 6L:
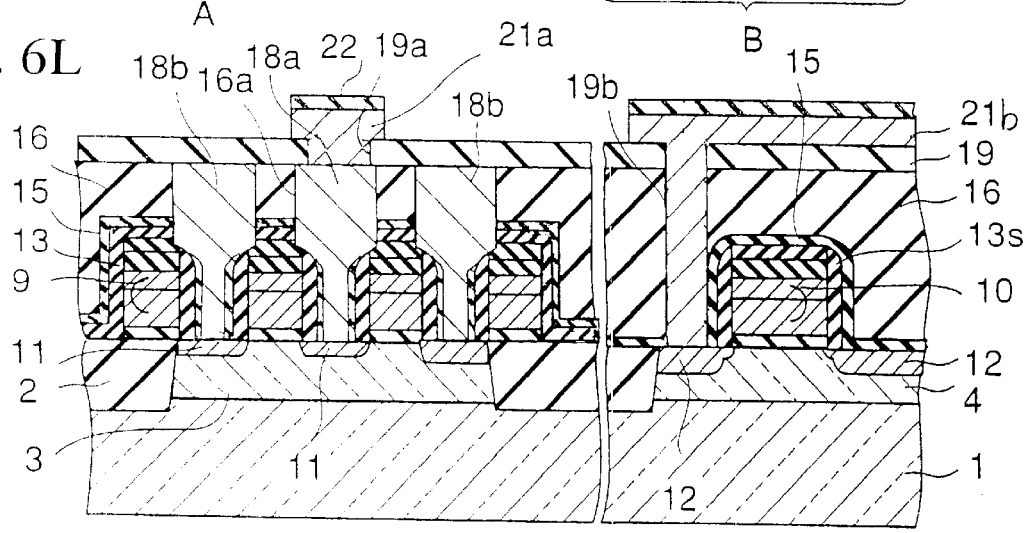

In addition, a bit-line-shaped resist pattern is formed in the memory cell region A and a wiring-shaped resist pattern is formed in the peripheral circuit region B, by coating the photoresist (not shown) on the reflection preventing film 22 and then exposing/developing it. Then, the reflection preventing film 22 and the metal film 21 are etched by using these resist patterns as a mask. Hence, as shown in FIG. 6L, the metal film 21 can be used as a bit line 21a in the memory cell region A and as a wiring 21b in the peripheral circuit region B. In some cases, the wiring 21b in the peripheral circuit region B constitutes a part of the bit line 21a.

Figure 7C:
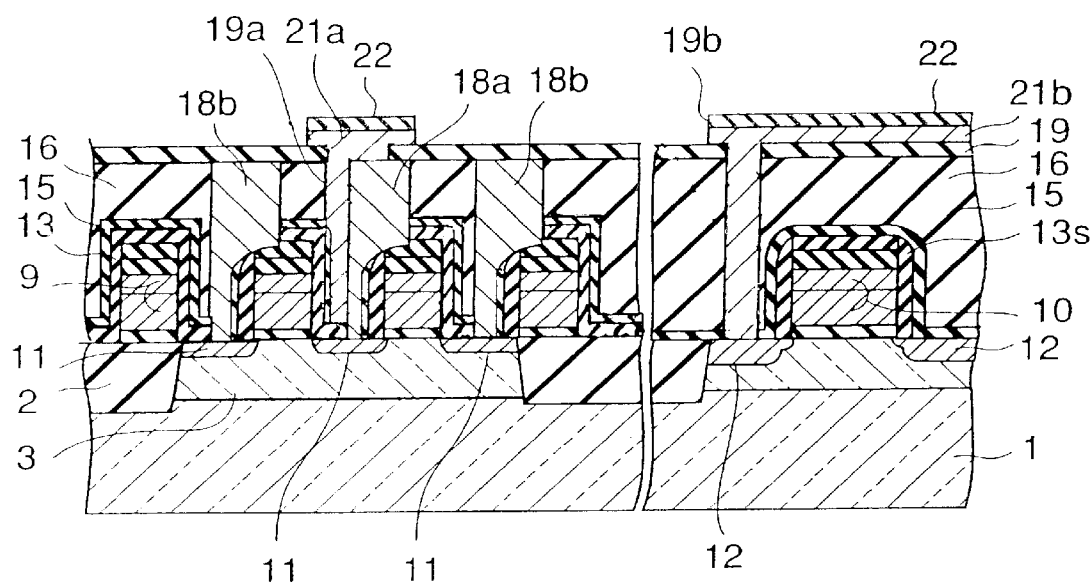

Meanwhile, as shown in FIG. 7C, if the bit-line contact via hole 19a is formed in the first interlayer insulating film 16 as shown in FIG. 7B, the bit line 21a is filled into the first interlayer insulating film 16. In this case, the connection of the metal film 21 to the silicon substrate 1 is blocked by the first silicon nitride film 13, and thus junction leakage between the impurity diffusion layer 11 and the bit line 21a is in no means generated. In this event, since the metal film 21 buried in the bit-line via hole 19a is connected to the side surface of the plug 18a, the situation that the contacting area between the bit line 21a and the plug 18a is reduced is never caused.

Figure 6M:
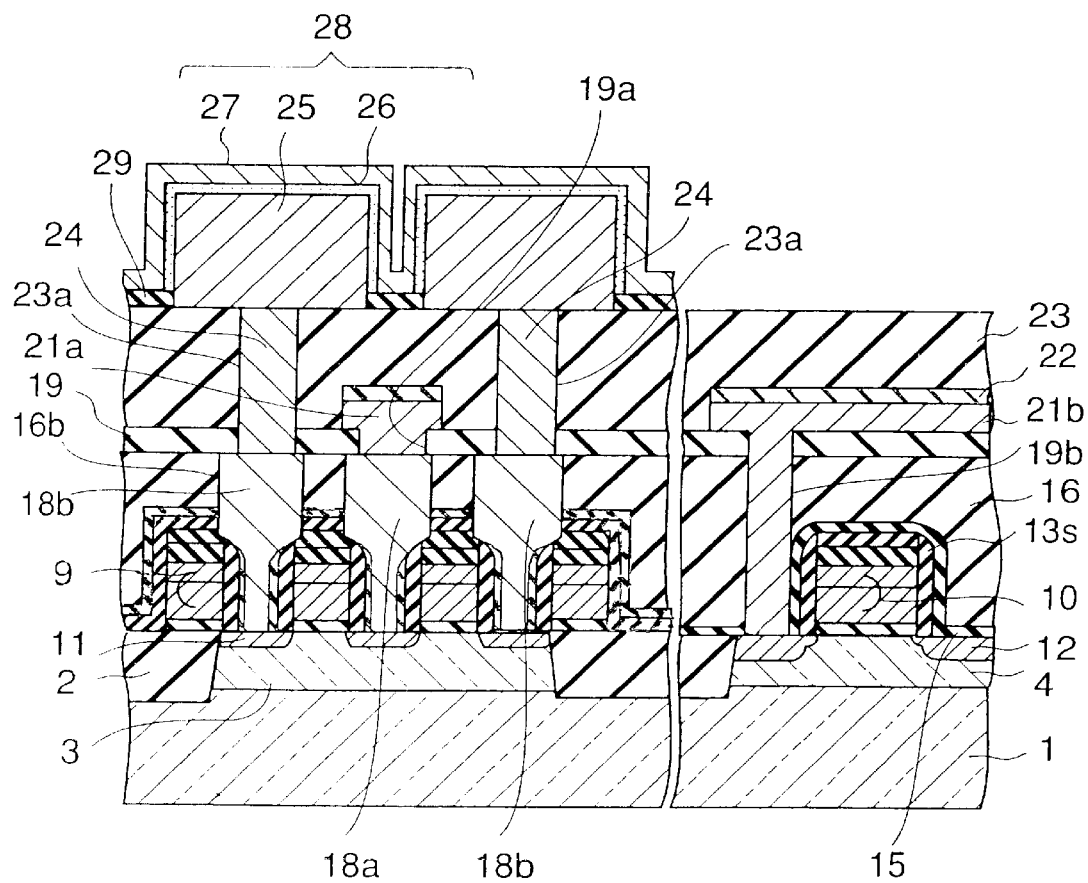

After the above bit line 21a is formed, as shown in FIG. 6M, a third interlayer insulating film 23 such as BPSG, etc., for covering the bit line 21a and the wiring 21b is formed, and then via holes 23a to be connected to the plug 18b in the storage contact hole 16b are formed by patterning the third interlayer insulating film 23. Then, plugs 24 made of phosphorus containing silicon are formed in the via holes 23a.

Then, a fourth interlayer insulating film 29 made of the silicon nitride film is formed to cover the plugs 24 and the third interlayer insulating film 23. Then, openings are formed on the plugs 24 and their peripheral areas by patterning the fourth interlayer insulating film 29 and an upper layer portion of the third interlayer insulating film 23. Storage electrodes 25 made of silicon and connected to the plugs 24 in the openings are formed on the third interlayer insulating film 23. Then, a dielectric film 26 is formed on a surface of the storage electrodes 25, and then an opposing electrode 27 is formed on the dielectric film 26. A capacitor 28 is composed of the storage electrode 25, the dielectric film 26, and the opposing electrode 27.

Figure 7D:
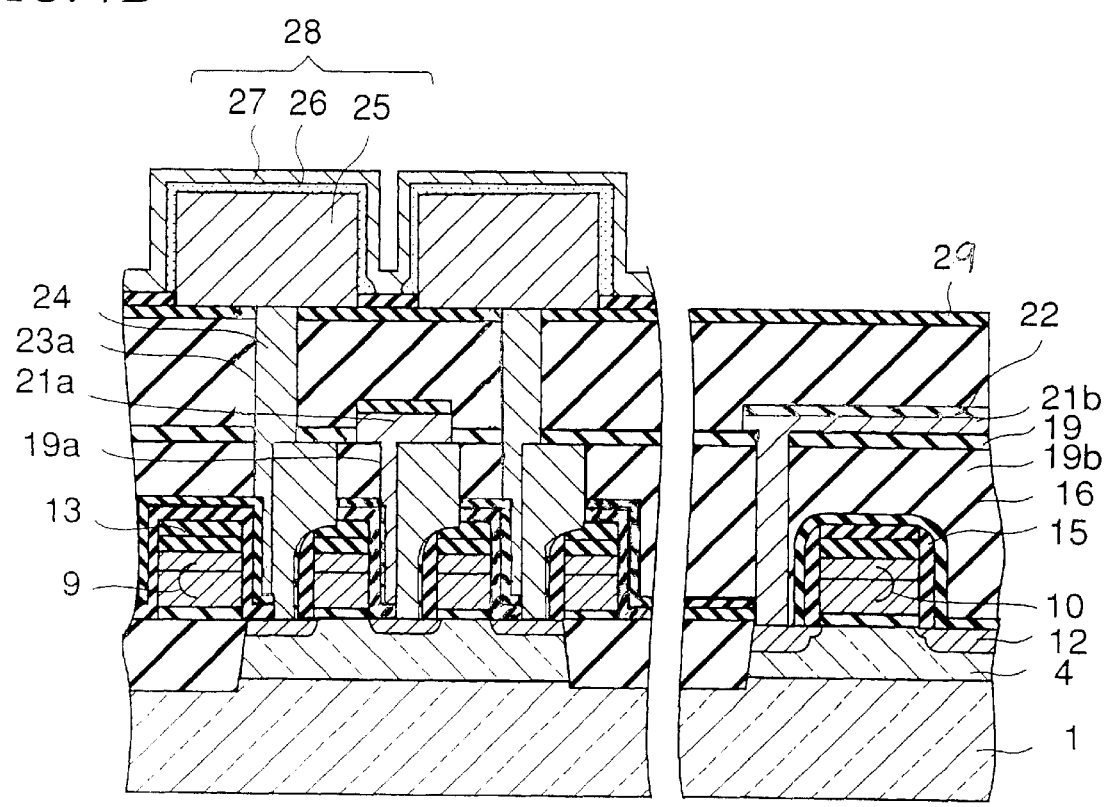

Meanwhile, if a position of the bit-line contact hole 16a and a position of via hole 19a are displaced, the capacitor 28 is formed as shown in FIG. 7D.

Figure 9:
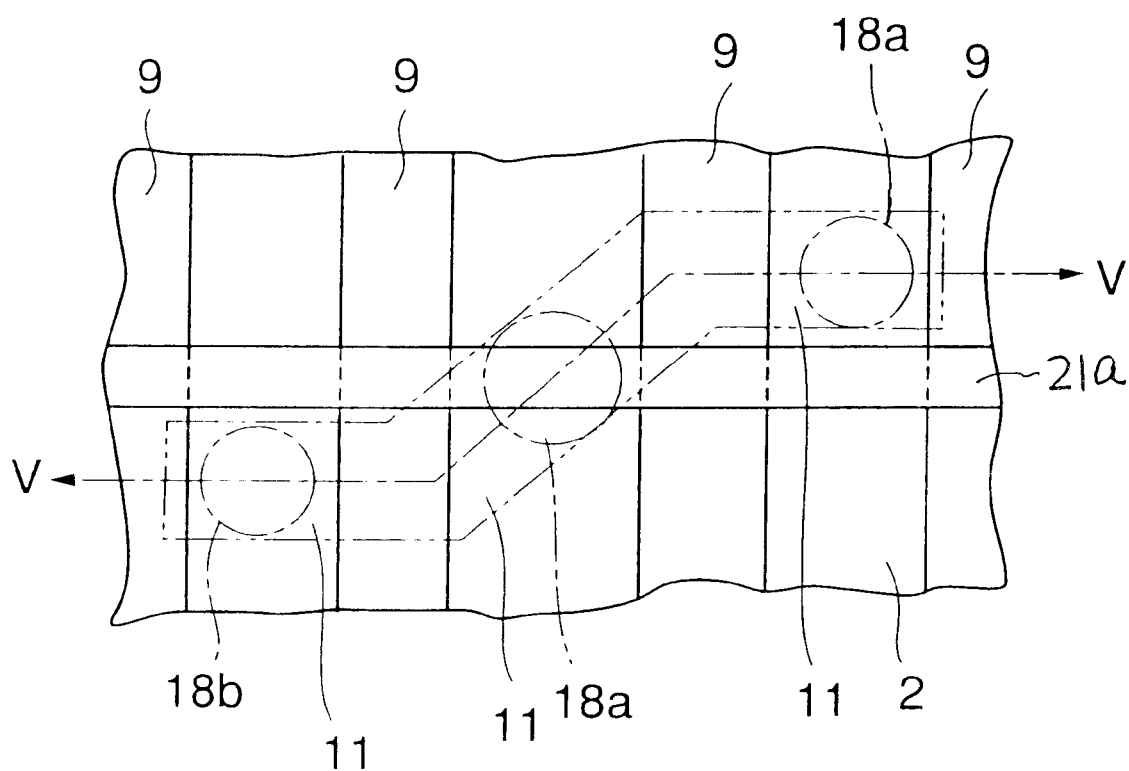
FIG. 9 is a plan view showing arrangement of elements in a memory cell region of the semiconductor device according to the first embodiment of the present invention.

The arrangement relationship among the impurity diffusion layer 11, the bit line 21a, and the gate electrodes 9 in the above memory cell region A is shown in FIG. 9 as a plan view. Sectional views of the memory cell region A in FIG. 6A to FIG. 7D show the sectional shape taken along a V—V line in FIG. 9 respectively.

Figure 1E:
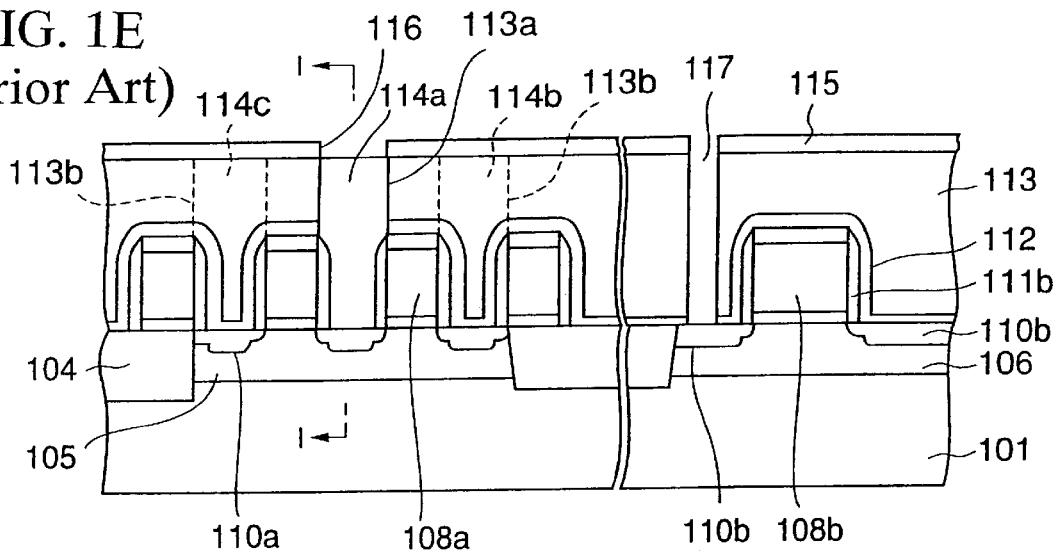
Figure 1F:
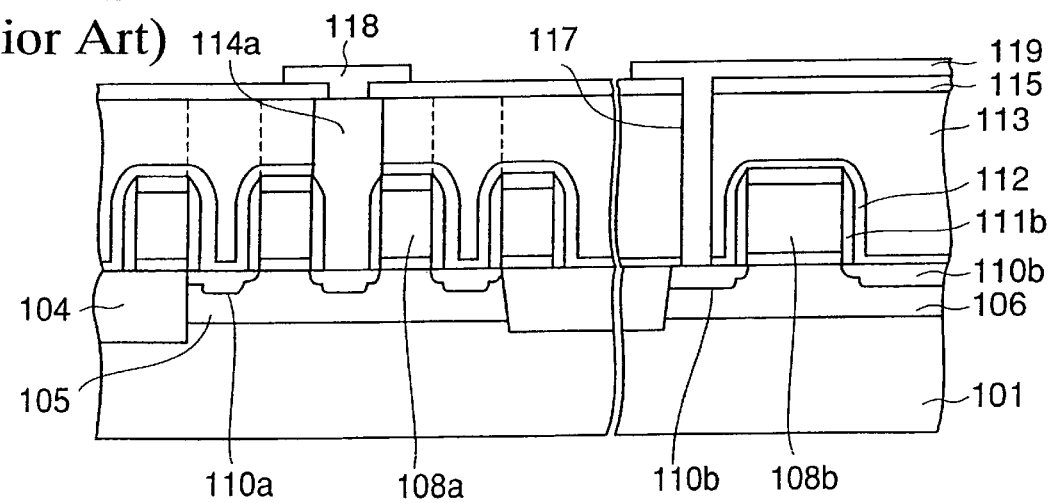
Figure 2A:
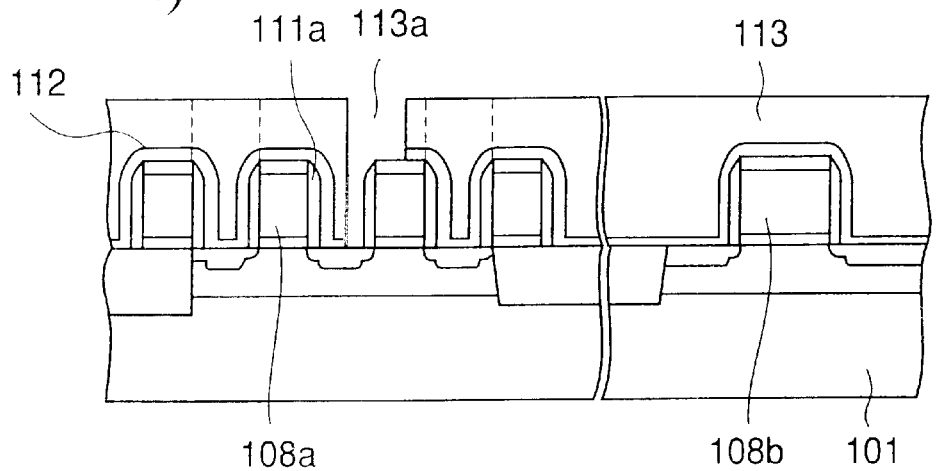
FIGS. 2A to 2C are sectional views showing manufacturing steps when displacement is caused between upper and lower holes in the semiconductor device manufacturing steps according to the first prior art.
Figure 2B:
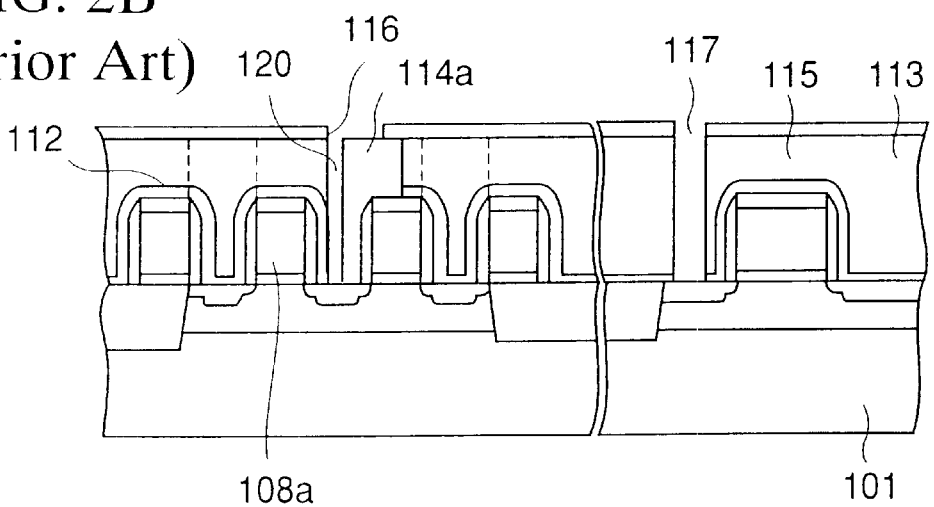
Figure 2C:
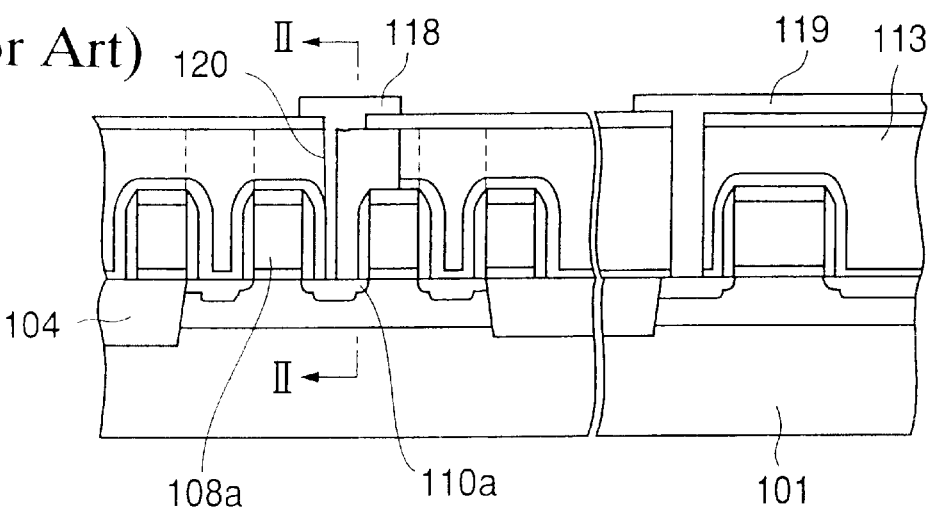
Figure 3A:
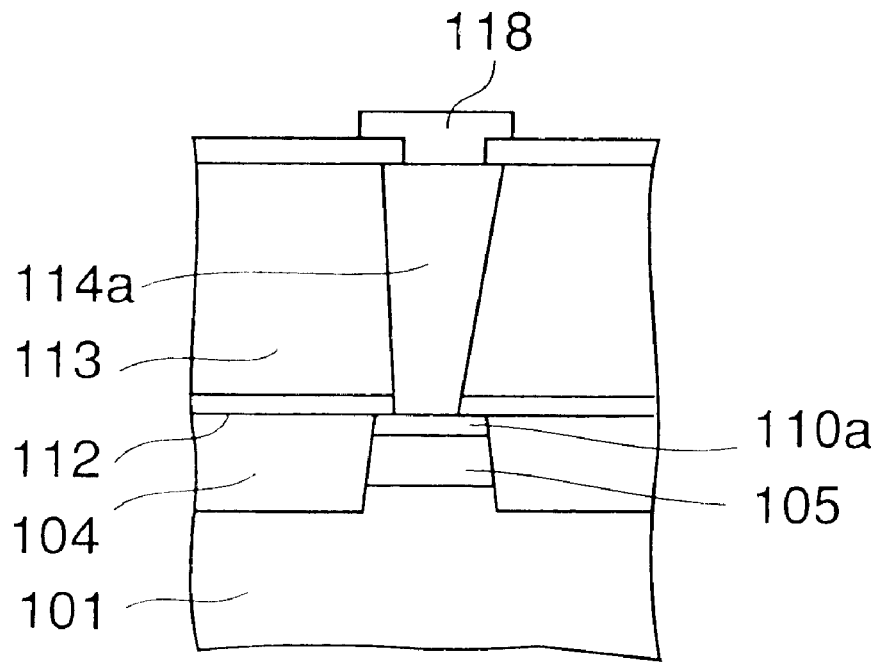
FIG. 3A is a sectional view showing a sectional shape of the semiconductor device, taken along a I—I line in FIG. 1E.
Figure 3B:
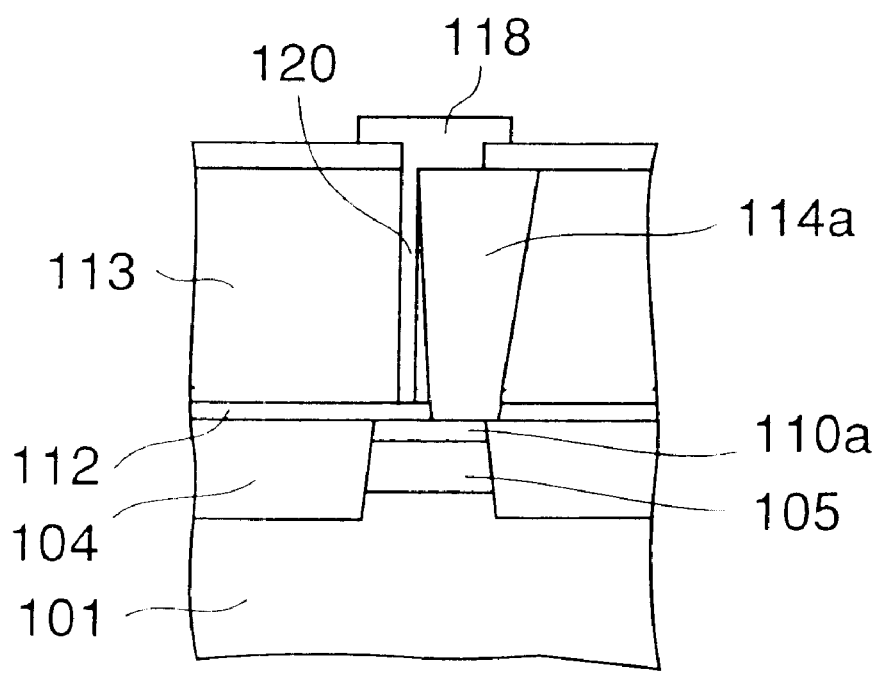
FIG. 3B is a sectional view showing a sectional shape of the semiconductor device, taken along a II—II line in FIG. 2C.
Figure 4:
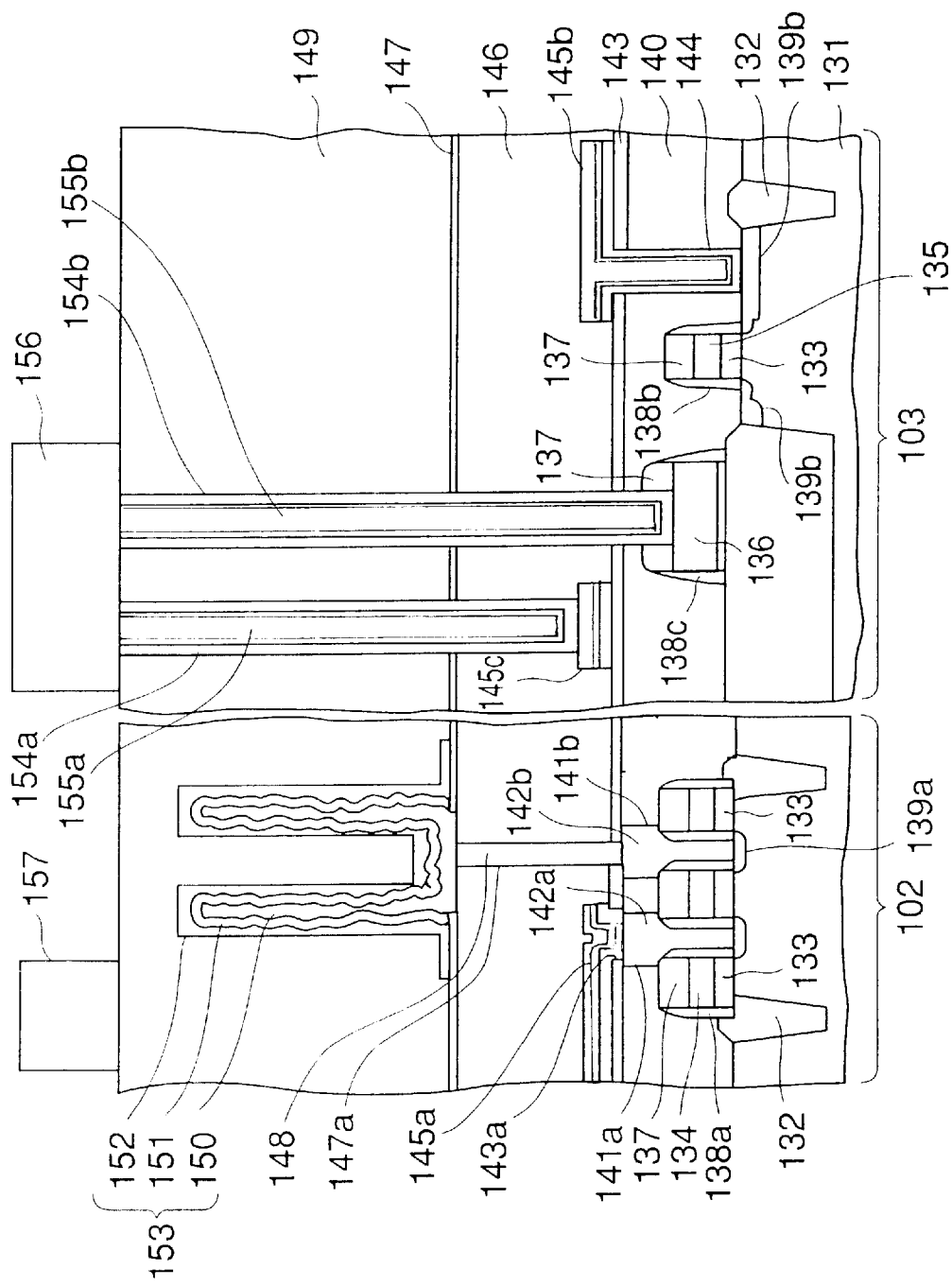
FIG. 4 is a sectional view showing a semiconductor device according to a second prior art.
Figure 5B:
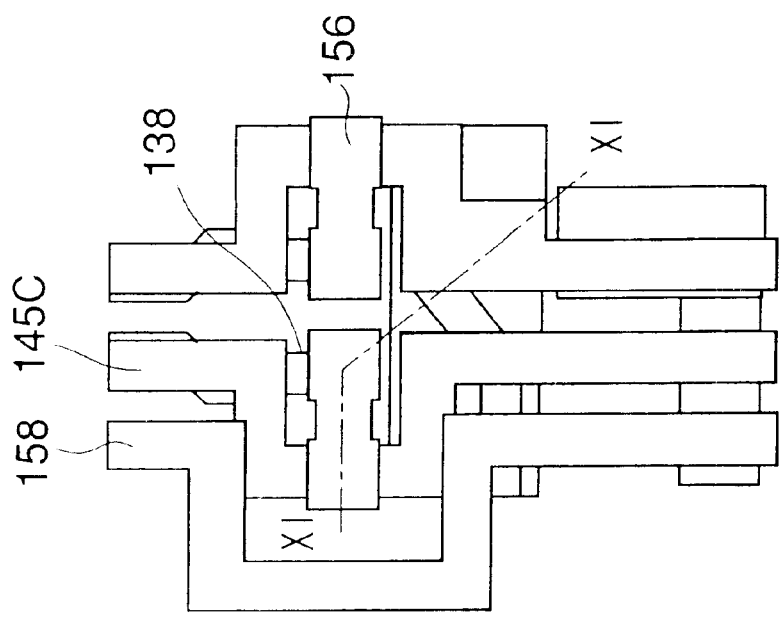
FIGS. 5A and 5B are plan views showing arrangement of respective elements of the semiconductor device shown in FIG. 4.
Figure 5A:
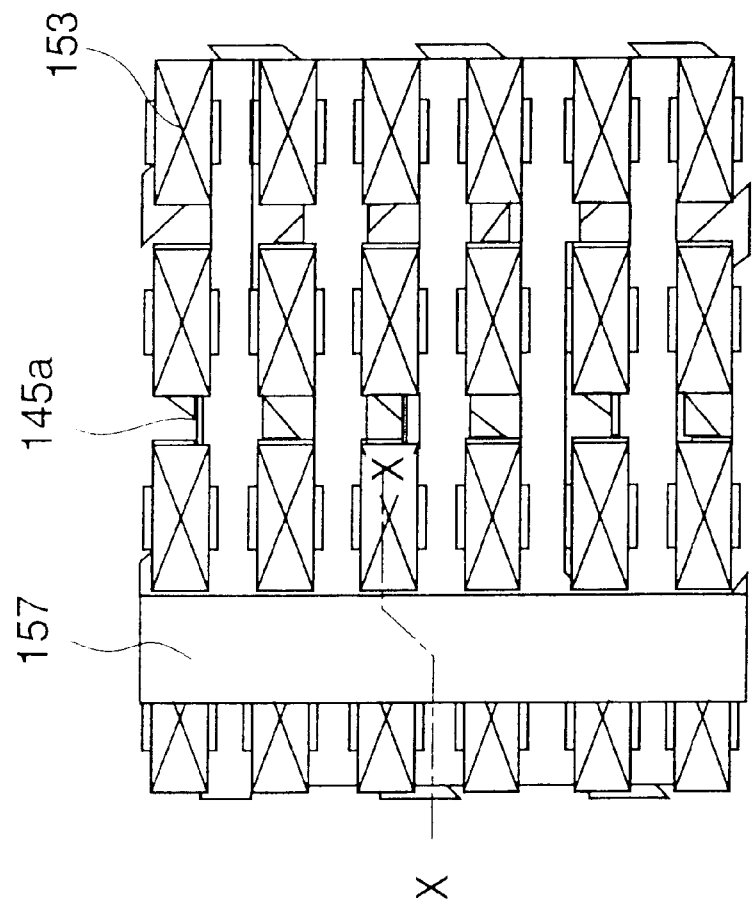

By the way, as shown in FIG. 1E in the column in the prior art, a diameter of the plug 114a must be set large in order to prevent the projection of the bit-line contact opening 116 from the upper surface of the plug 114a. In case the diameter of the plug 114a is large, an interval between the gate electrodes 108a must be extended in order to assure the breakdown voltage between the plugs 114a.

Figure 10A:
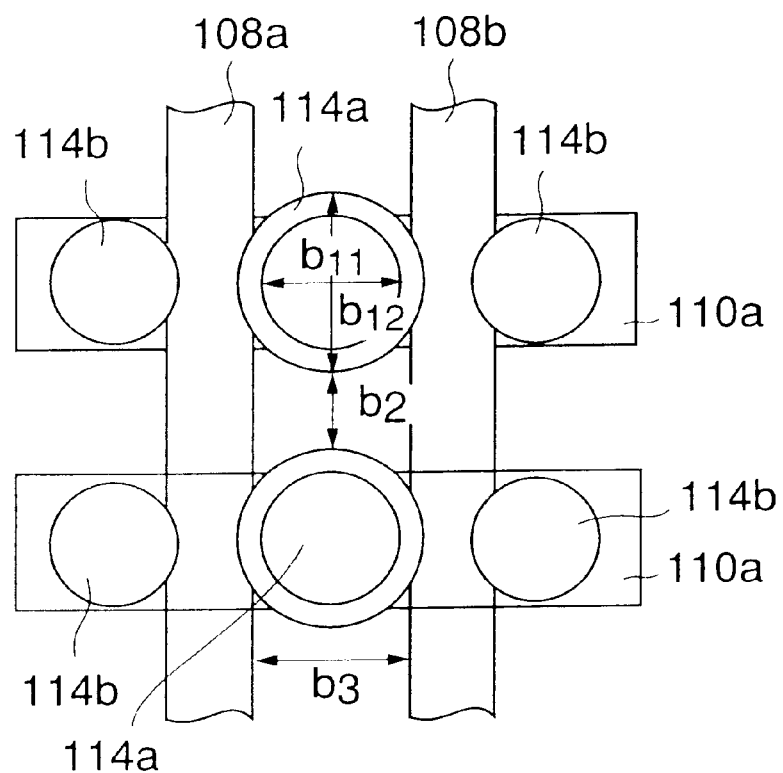
FIG. 10A is a plan view showing sizes and arrangement of the plugs in the semiconductor device according to the first embodiment of the present invention.

For example, as shown in FIG. 10A, assume that the necessary minimum diameter $b_{12}$ of the upper surface of the plug is 0.25 μm. The overlapping of the plugs 114a and the gate electrodes 108a is formed by the SAC and about 0.025 μm is needed in one side. A distance $b_2$ required to assure the insulating breakdown voltage between the plugs 114a is set to 0.10 μm, and a positional displacement margin of the bit contact needs 0.20 μm m on both sides in the X/Y directions. In the prior art method, since the displacement of the bit-line opening (via hole) 116 from the upper surface of the plugs 114a is never permitted, the necessary plug diameter $b_{11}$ containing the positional displacement margin needs 0.25+ 0.20=0.45 μm. Accordingly, in the prior art method, a pitch $b_3$ between the gate electrodes 108a is obtained by adding the diameter of the plug 114a and the distance required for the insulating breakdown voltage between the plugs 114a and then subtracting the overlapping of SAC from above resultant, i.e., almost 0.45+0.10−2×0.025=0.50 μm.

Figure 10B:
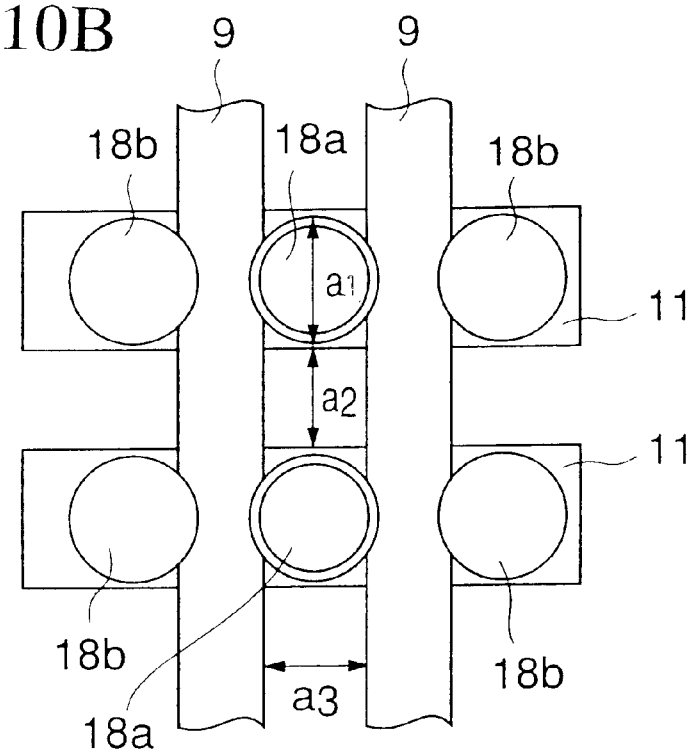
FIG. 10B is a plan view showing sizes and arrangement of the plugs in the prior art.

In contrast, in the first embodiment, as shown in FIG. 10B, because there is no necessity to consider the positional displacement margin between the plug 18a and the via hole 19a, only 0.50 μm is needed as a diameter al of the plug 18a. Accordingly, a pitch $a_3$ between the gate electrodes 9 is given only by 0.25+0.10−2×0.025=0.30 μm. In this case, a distance a2 between the plugs 18a is set to 0.50 μm similarly to that in the prior art.

Also, the distance between the bit lines needs 0.30 μm in the prior art, but needs merely 0.10 μm in the first embodiment.

With the above, according to the semiconductor device manufacturing method of the first embodiment, it can be understood that such method can contribute to the higher integration of the semiconductor device rather than the semiconductor device manufacturing method in the prior art.

The semiconductor device and the method of manufacturing the same set forth in Patent Application Publication (KOKAI) Hei 11-87653 also relates to the method of opening firmly the SAC window in case the pattern density is increased. However, the first embodiment of the present invention differs from the prior art in that firstly the opening of the bit-line via holes is performed simultaneously in the peripheral circuit region and the memory cell region and secondly the opening of the bit-line contact hole in the memory cell region is advantageous in the situation that the positional displacement from the upper surface of the plugs is caused.

The bit line 21a in the memory cell region A shown in FIGS. 6K and 6L is connected directly to the plug 18a via the via hole 19a in the second interlayer insulating film 19, and the wiring 21b in the peripheral circuit region B is connected directly to the impurity diffusion layer 12 via the contact hole 19b in the second interlayer insulating film 19. But these line structures are not limited to the above structure.

Figure 11A:
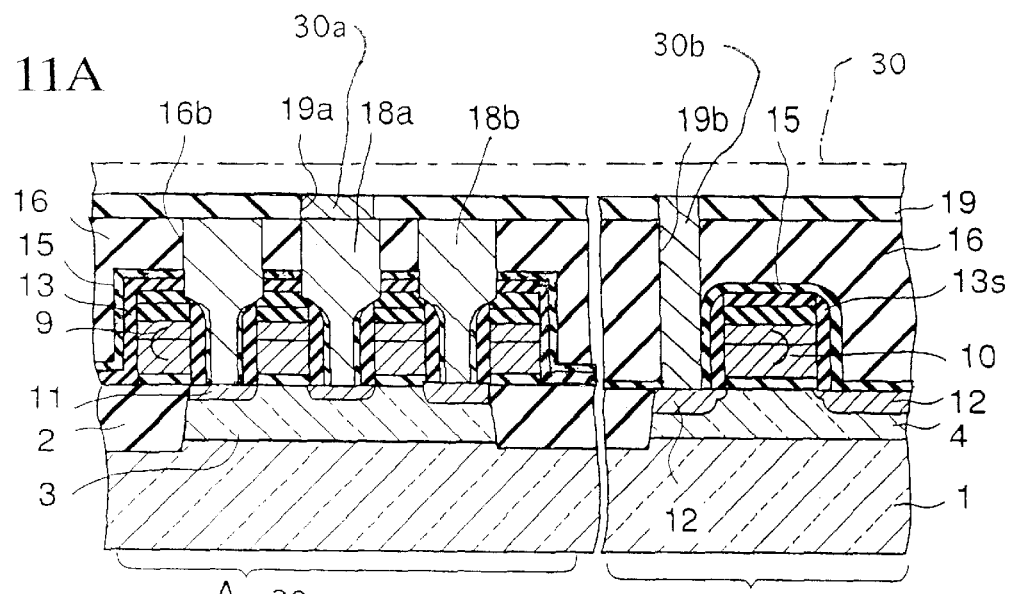
FIGS. 11A to 11C are sectional views showing another structures concerning to connection between bit wirings and plugs in a memory cell region and connection between wirings and impurity diffusion layers in a peripheral circuit region, in the semiconductor device according to the first embodiment of the present invention.
Figure 11B:
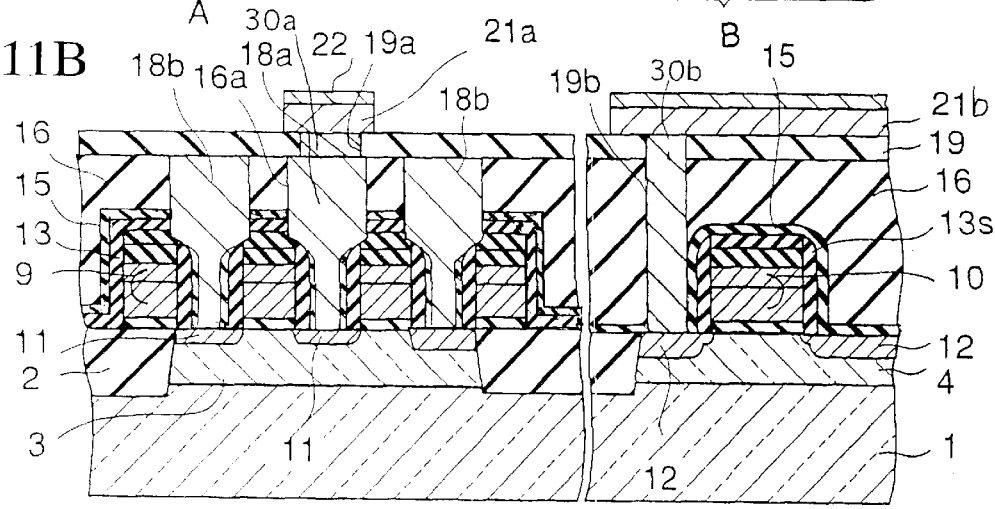

For example, as shown in FIGS. 11A and 11B, after the via hole 19a and the contact hole 19b are formed in the second interlayer insulating film 19, there may be adopted steps of forming the via hole 19a and the contact hole 19a and forming the bit line 21a in the memory cell region A and the wiring 21b in the peripheral circuit region B. The bit line 21a and the wiring 21b are formed by the steps of forming a triple-layered metal film 30 of titanium, titanium nitride and tungsten in the via hole 19a and the contact hole 19b and on the second interlayer insulating film 19, polishing the triple-layered metal film 30 by virtue of the CMP method to remove from the upper surface of the second interlayer insulating film 19 and to leave only in the via hole 19a and the contact hole 19b as the plugs 30a, 30b, forming a multi-layered metal film and a SiON reflection preventing film 22 on these plugs 30a, 30b and the second interlayer insulating film 19, and patterning the multi-layered metal film and the SiDN reflection preventing film 22 by virtue of the photolithography method.

Figure 11C:
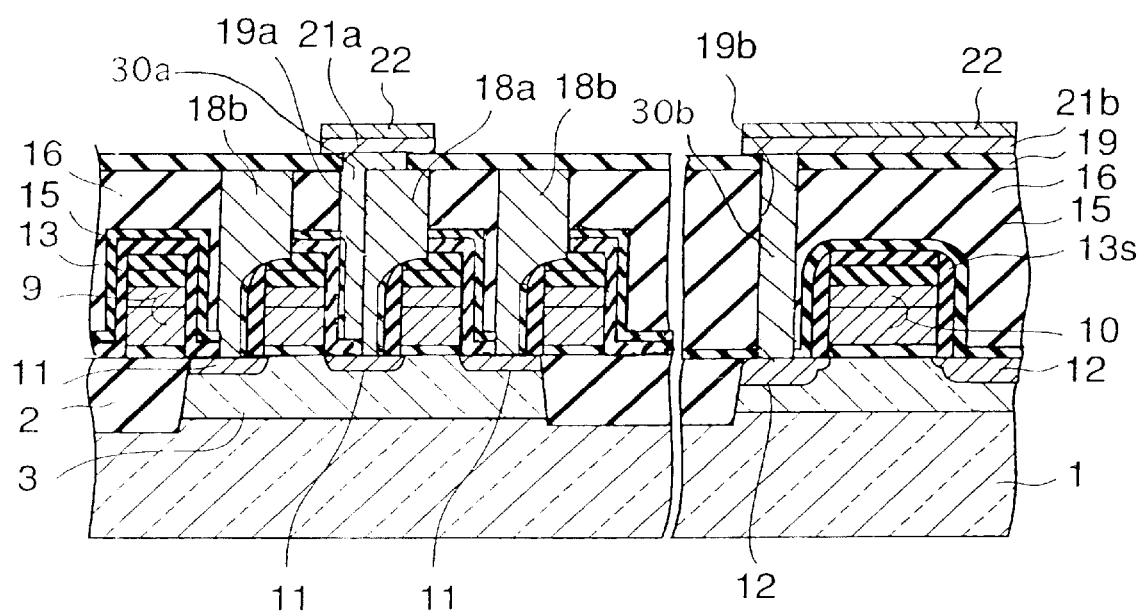

Then, in the case that the bit-line contact hole 16a is formed to displace to the gate electrode 9 as shown in FIG. 7B and also the via hole 19a is formed on the first interlayer insulating film 16 and in the second silicon nitride film 15 to project from the upper surface of the plug in the contact hole 16a, the contact of the plugs 30a, 30b in the above via hole 19a to the impurity diffusion layers 11 can be cut off by the first silicon nitride film 13, as shown in FIG. 11C.

Second Embodiment

FIGS. 12A to 12D and FIGS. 13A to 13C are sectional views showing semiconductor device manufacturing steps according to a second embodiment of the present invention.

In FIGS. 12A to 12D and FIGS. 13A to 13C, the same references as those in FIG. 6A denote the same elements.

First, steps required to get the structure shown in FIG. 12A will be explained.

Figure 12A:
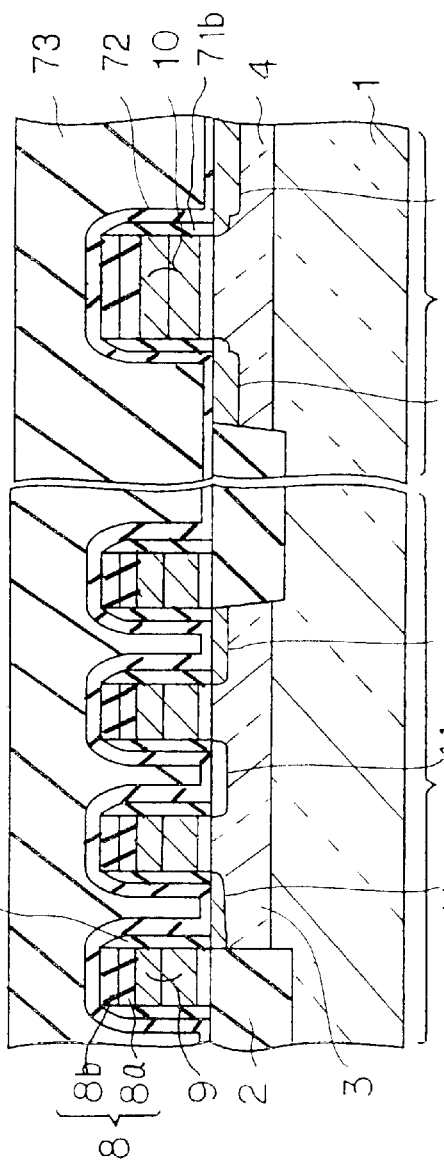

In FIG. 12A, the gate electrodes 9, 10 are formed in the memory cell region A and the peripheral circuit region B on the silicon substrate 1 via the gate oxide film 5 by the similar steps to those shown in FIG. 6A in the first embodiment. A protection insulating film 8 consisting of the SiON film 8a and the silicon nitride film 8b is formed on the gate electrodes 9, 10. Then, the impurity diffusion layers 11, 12 are formed between a plurality of gate electrodes 9 in the memory cell region A and on both sides of the gate electrodes 9, 10 in the peripheral circuit region B respectively.

The impurity diffusion layers 12 in the peripheral circuit region B have an LDD structure by the later impurity ion implantation.

Under such condition, the first silicon nitride film for covering the gate electrodes 9, 10 and the silicon substrate 1 is formed, and then the silicon nitride film is left only on the side walls of the gate electrodes 9, 10 as sidewalls 71a, 71b by etching-back the first silicon nitride film.

After this, a second silicon nitride film 72 of 60 nm thickness, for example, is formed on the protection insulating film 8, the sidewalls 71a, 71b, and the silicon substrate 1 by the CVD method. Then, a first interlayer insulating film 73 made of PBSG is formed on the second silicon nitride film 72 to have a thickness of 500 nm, for example. Then, a surface of the first interlayer insulating film 73 is planarized by heating to reflow or by polishing by means of the CMP method.

Next, steps required to get the structure shown in FIG. 12B will be explained hereunder.

First, contact holes 73a, 73b are formed over the impurity diffusion layers 11 existing in the memory cell region A by patterning the first interlayer insulating film 73 by using the photolithography method. The etching in such patterning is carried out by using a mixed gas containing $C_4F_8$ and $CH_2F_2$, and the second silicon nitride film 72 acts as the etching stopper. Then, the second silicon nitride film 72 under the contact holes 73a, 73b is etched. Such etching is carried out by using a mixed gas containing $CHF_3$ and $O_2$.

In addition, a phosphorus containing polysilicon film is formed in the contact holes 73a, 73b and on the first interlayer insulating film 73, and then the polysilicon film is removed from the upper surface of the first interlayer insulating film 73 by polishing the polysilicon film by virtue of the CMP method.

Accordingly, the polysilicon film that is left in the contact hole 73a in the center of the active region is used as the bit-line contact plug 74a, while the polysilicon film that is left in the contact hole 73b in the active region is used as the storage contact plug 74b.

Then, a high temperature oxide film is formed as a second interlayer insulating film 75 on the plugs 74a, 74b and the first interlayer insulating film 73.

Figure 12B:
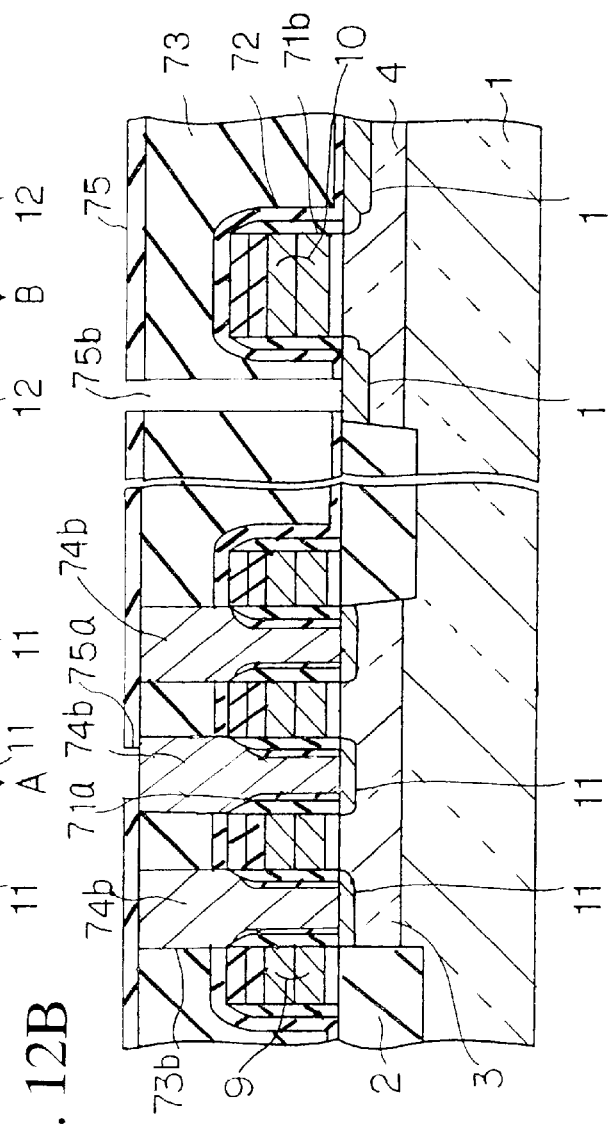

Then, as shown in FIG. 12B, a hole 75a is formed on the bit-line contact plug 74a by patterning the second interlayer insulating film 75 in the memory cell region A by means of the photolithography method, and at the same time a contact hole 75b is formed on the impurity diffusion layer 12 by patterning the first and second interlayer insulating films 73, 75 and the second silicon nitride film 72 in the peripheral circuit region B. In such patterning, the mixed gas containing $C_4F_8$ and $CH_2F_2$ is used as the etching gas of the first and second interlayer insulating films 73, 75, and the mixed gas containing $CHF_3$ and $O_2$ is used as the etching gas of the second silicon nitride film 72.

As shown in FIG. 13A, if the bit-line contact hole 73a formed between the gate electrodes 9 in the memory cell region A is displaced to the gate electrode 9 on one side but the overlying hole 75a is formed in the normal position during these steps, a clearance is formed between the hole 75a and the plug 74a formed in the hole 73a.

In this case, because the hole 75a is also formed in the second silicon nitride film 72, the underlying impurity diffusion layer 11 is exposed.

Therefore, as shown in FIG. 13B, after the bit-line contact hole 75a and the contact hole 75b are formed in the second interlayer insulating film 75, etc., a third silicon nitride film 76 is formed on the second interlayer insulating film 75 and in the hole 75a and the contact hole 75b to have such a thickness that can bury the hole 75a on the side of the plug 74a, e.g., half thickness of the second silicon nitride film 72, if the bit-line contact hole 75a is projected from the side of the plug 74a. Then, the third silicon nitride film 76 is removed from the upper surfaces of the second interlayer insulating film 75 and the plug 74a and the inner surface of the contact hole 75b by etching-back the third silicon nitride film 76, but is left only on the side portions of the plug 74a in the hole 75a. Since the portion formed on the side portions of the plug 74a in the hole 75a is extremely narrow, it is easy to leave selectively the third silicon nitride film 76 at least on the bottom portion of the hole 75a under the condition that the third silicon nitride film 76 on the plug 74a is removed.

In this case, as shown in FIG. 12C, in case the position of the bit-line contact hole 73a coincides with the position of the hole 75a, the third silicon nitride film 76 in the bit-line contact hole 73a and the contact hole 75b in the peripheral circuit region B is removed by the etching-back.

After the third silicon nitride film 76 is etched back, such third silicon nitride film 76 is left on the side walls of the contact hole 75b in the peripheral circuit region B to thus reduce a diameter of the hole correspondingly. Therefore, the diameter of the contact hole 75b must be expanded previously by the film thickness of the third silicon nitride film 76.

Then, as shown in FIG. 12D, a bit line 77a is formed on the second interlayer insulating film 75 in the memory cell region A such that the bit line 77a is connected to the plug 74a via the hole 75a, whereas a wiring 77b is formed on the second interlayer insulating film 75 in the peripheral circuit region B such that the wiring 77b is connected to the impurity diffusion layer 12 via the contact hole 75b.

As explained in the first embodiment, the bit line 77a and the wiring 77b may be connected to the underlying plug via a metal plug (not shown) formed in the hole 75a, otherwise the wiring 77b may be connected to the impurity diffusion layer 12 via a metal plug (not shown) formed in the contact hole 75b.

Figure 13C:
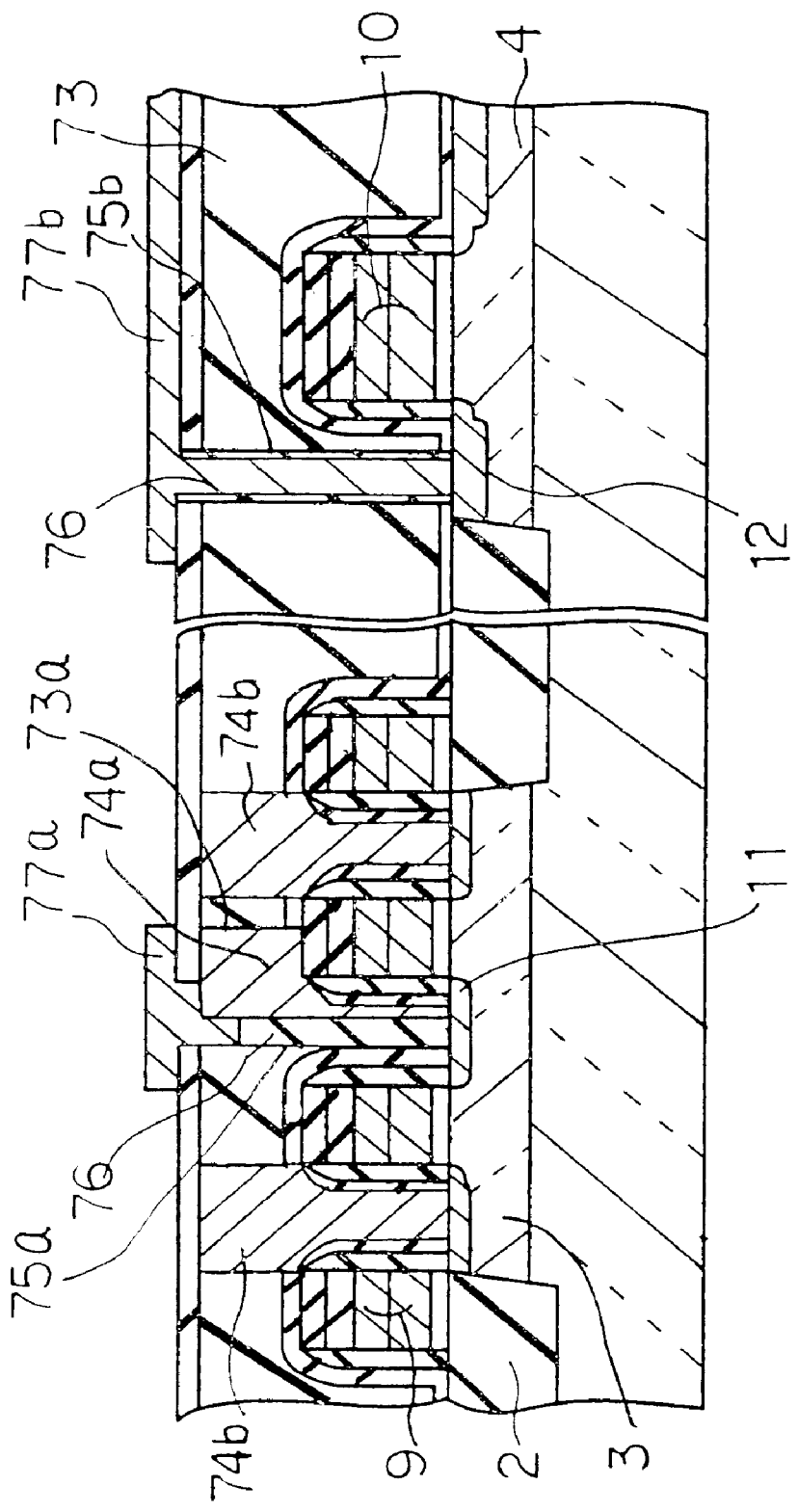

In the meanwhile, as shown in FIG. 13C, even if the hole 75a is formed up to the side of the plug 73a because the bit-line contact plug 73a and the overlying hole 75a are displaced relatively, contact of the metal in the hole 75a to the impurity diffusion layer 11 can be disconnected by the underlying third silicon nitride film 76. Therefore, the increase in the leakage current due to diffusion of the metal into the impurity diffusion layer 11 can be prevented.

As described above, after the bit line 77a and the wiring 77b are formed, the capacitor connected to the storage contact plug 74b is formed via the similar steps to those in the first embodiment, but its details will be omitted.

According to above steps, if the silicon nitride film formed on the silicon substrate 1 is etched in the peripheral circuit region B, the mask for covering the memory cell region A is not needed and thus the steps can be reduced.

In this case, the third silicon nitride film 75 may be left only in the hole 75a on the side of the plug 73a by patterning the third silicon nitride film 75 using the photoresist as a mask.

Third Embodiment

FIGS. 14A to 14G are sectional views showing semiconductor device manufacturing steps according to a third embodiment of the present invention.

Figure 14A:
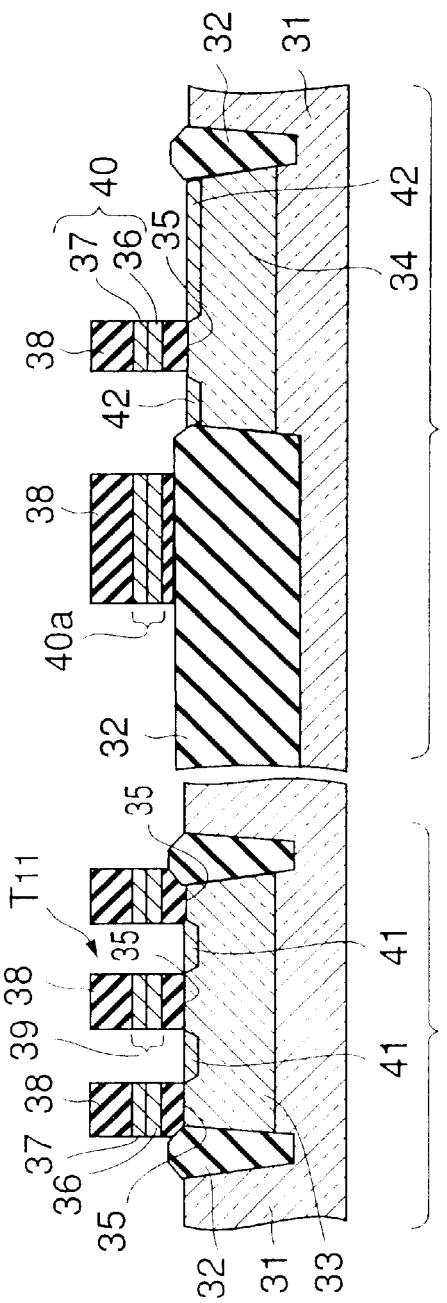
FIGS. 14A to 14G are sectional views showing a manufacturing steps of a semiconductor device according to a third embodiment of the present invention.

First, steps required to get the structure shown in FIG. 14A will be explained hereunder.

Like the first embodiment, the memory cell region A and the peripheral circuit region B are present on an n-type silicon substrate (semiconductor substrate) 31, and a device isolation insulating film 32 having the STI structure is formed in these regions A, B of the silicon substrate 31. Here, the device isolation method such as LOCOS and others may be employed instead of the STI structure.

After such device isolation insulating film 32 is formed, wells 33, 34 are formed by the same method as the first embodiment.

Then, a gate oxide film 35 is formed by thermally oxidizing the surface of the silicon substrate 31 in the active region.

In addition, a polysilicon layer 36 of 80 nm thickness and a tungsten silicide layer 37 of 100 nm thickness are formed in sequence on the gate oxide film 35, and then a protection insulating film 38 is formed on the tungsten silicide layer 37. The silicon oxide ($SiO_2$) film of 132 nm thickness is employed as the protection insulating film 38.

Then, the polysilicon layer 36, the tungsten silicide layer 37, and the protection insulating film 38 are patterned into the gate electrode profile and the wiring profile by the photolithography method. This patterning is performed by using the reflection preventing film, e.g., BARC (Bottom-Anti-Reflective-Coating), etc.

Therefore, a plurality of gate electrodes 39 consisting of a silicon layer 36 and a silicide layer 37 respectively and used commonly as the word line is formed in the memory cell region A, while a plurality of gate electrodes 40 consisting of the silicon layer 36 and the silicide layer 37 respectively are formed in the peripheral circuit region B. At the same time, a first layer wiring 40a passing through over the device isolation insulating film 32 is also formed in the peripheral circuit region B. The first layer wiring 40a may have a structure that extends the gate electrode 40 to the device isolation insulating film 32.

Further, an n-type impurity diffusion layer 41 is formed on both sides of the gate electrodes 39 by implanting selectively the n-type impurity ion into the memory cell region A of the silicon substrate 31 while using a resist mask (not shown) in which the memory cell region A is opened. A basic MOS transistor $T_{11}$ consists of the n-type impurity diffusion layer 41 and the gate electrode 39 in the memory cell region A. Then, low concentration portions of impurity diffusion layers 42 serving as the source/drain are formed on both sides of the gate electrodes 40 by implanting selectively the impurity ion into the peripheral circuit region B of the silicon substrate 31 while using a resist mask (not shown) in which the peripheral circuit region B is opened.

Figure 14B:
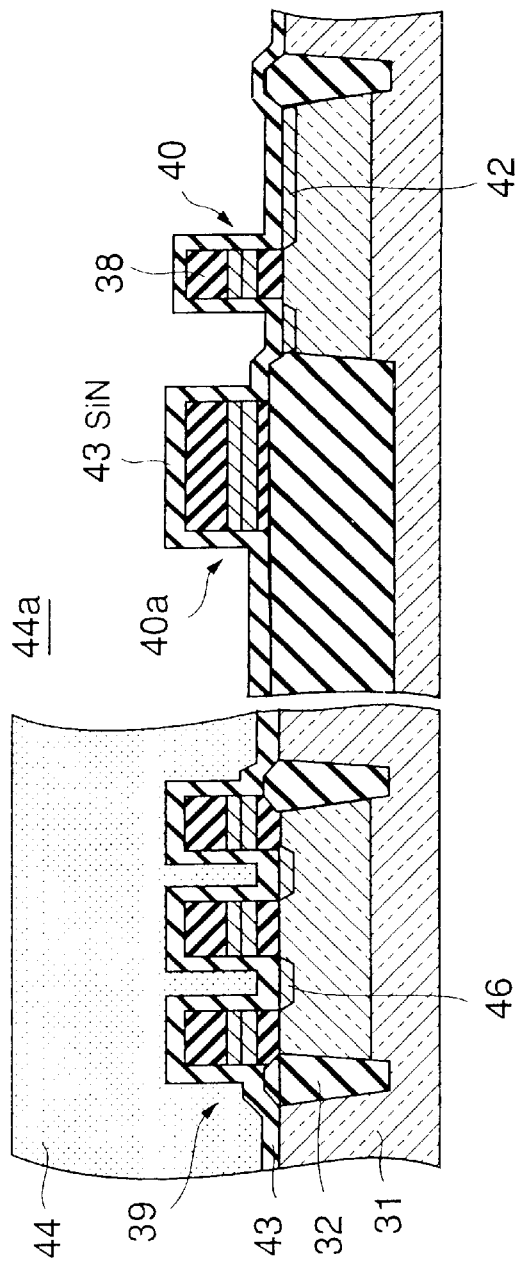

Then, as shown in FIG. 14B, a silicon nitride film 43 of 20 to 100 nm thickness, e.g., 60 nm thickness is formed by the chemical vapor deposition method using a silane ($SiH_4$) gas and an ammonia ($NH_3$) gas to cover upper surfaces and side surfaces of the gate electrodes 39, 40 and the upper surface of the silicon substrate 31.

In addition, an opening 44a to expose the peripheral circuit region B is formed by coating photoresist 44 on the silicon nitride film 43 and then exposing/developing it. Then, the silicon nitride film 43 in the peripheral circuit region B is etched via the opening 44a in the substantially perpendicular direction to the surface of the substrate by virtue of the anisotropic etching. In this etching, the gas seed similar to the first embodiment is employed.

Figure 14C:
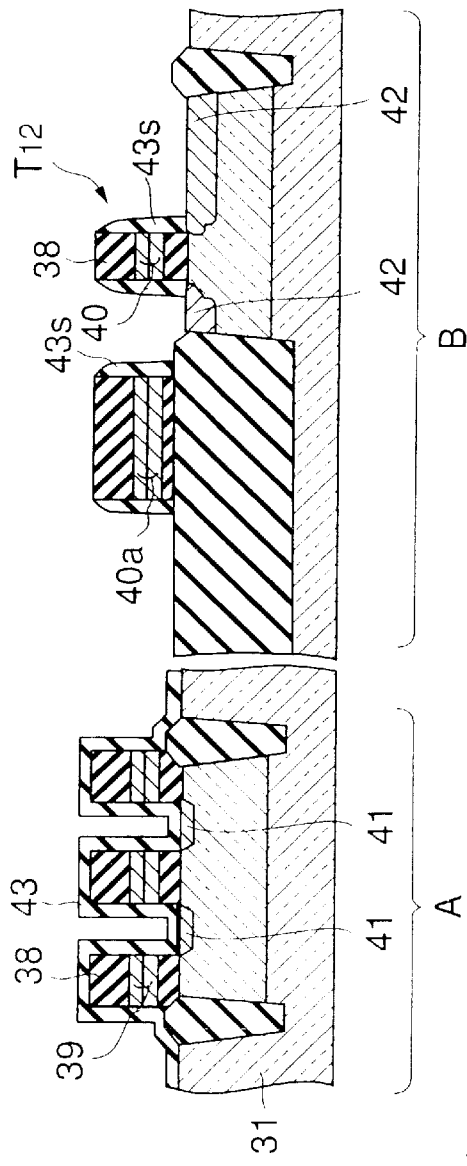

Accordingly, as shown in FIGS. 14C, the silicon nitride film 43 is left as sidewall spacers 43s on side surfaces of the gate electrodes 40 and the wiring 40a in the peripheral circuit region B, while the silicon substrate 31 between the gate electrodes 39 is still covered with the silicon nitride film 43 in the memory cell region A.

After the photoresist 44 is removed, the silicon oxide film (not shown) is formed in the peripheral circuit region B on the surface of the silicon substrate 31 by the thermal oxidation method.

Then, the impurity is ion-implanted into the peripheral circuit region B of the silicon substrate 31 by using the gate electrodes 40 and the sidewall spacers 43s in the peripheral circuit region B as a mask. Accordingly, high concentration portions are formed in the impurity diffusion layers 42 on both sides of the gate electrodes 40 in the peripheral circuit region B, whereby the impurity diffusion layers 42 have the LDD structure respectively. Then, the basic structure of the MOS transistor $T_{12}$ is completed in the peripheral circuit region B.

In this case, the resist masks are used in the peripheral circuit region B to introduce the p-type impurity and the n-type impurity into desired areas respectively, but the memory cell region A is covered with the resist mask when any impurity is injected.

Figure 14D:
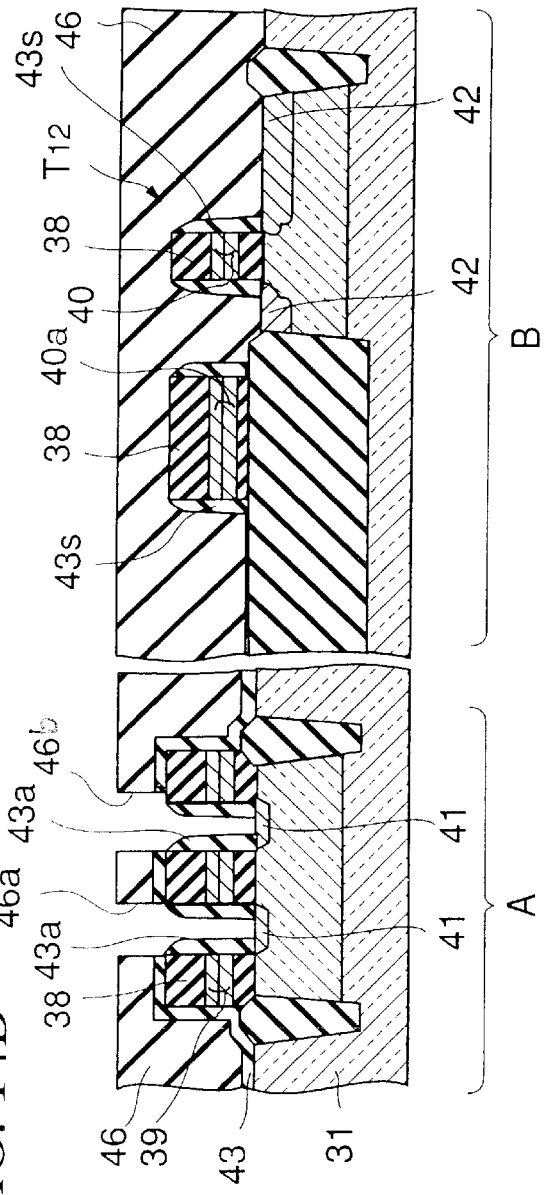

Then, steps required to get the structure shown in FIG. 14D will be explained.

First, a first interlayer insulating film 46 made of BPSG is formed on the silicon nitride film 43 in the memory cell region A and the protection insulating film 38, the sidewalls 43s and the silicon substrate 31 in the peripheral circuit region B by using the chemical vapor deposition method to have a thickness of 500 nm, for example.

Next, an upper surface of the first interlayer insulating film 46 is made flat by heating the first interlayer insulating film 46 to reflow or by the chemical mechanical polishing (CMP).

Then, like the first embodiment, a bit-line contact hole 46a and a storage contact hole 46b are formed in the first interlayer insulating film 46 by anisotropic-etching the first interlayer insulating film 46 by using the self-align method. In this etching, the condition such that the underlying silicon nitride film 43 can be left even a little amount by using the mixed gas of $C_4F_8$ and $CH_2F_2$, for example, is set. Subsequently, the silicon nitride film 43 that appears under the bit-line contact hole 46a and the storage contact hole 46b is etched by using the gas system containing $CHF_3$, for example, whereby the bit-line contact hole 46a and the storage contact hole 46b can have depths to reach the surface of the silicon substrate 1. In this case, the etching condition is set to leave the silicon nitride film 43 on the side walls of the gate electrode 39 as sidewall spacers 43a. Also, because the silicon nitride film 43 on the gate electrodes 39 is selectively etched to the underlying $SiO_2$ protection insulating film 38, the silicon nitride film 43 is never exposed.

Figure 14E:
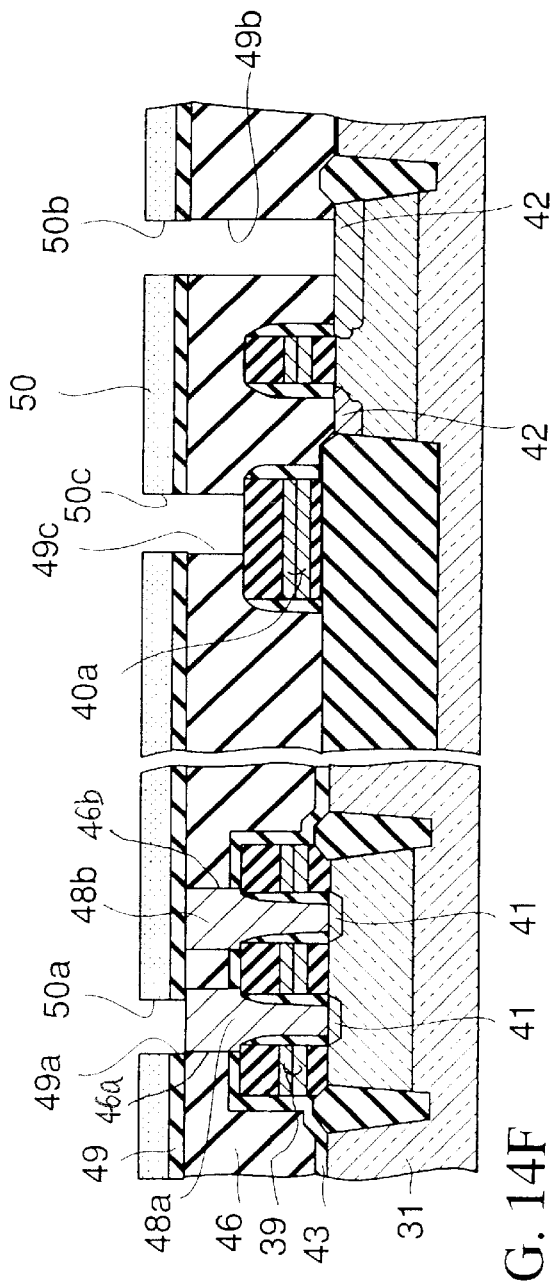

Then, steps required to get the structure shown in FIG. 14E will be explained.

The polysilicon film is filled into the contact holes 46a, 46b in the memory cell region A by growing the phosphorus-doped polysilicon film up to a thickness of 200 nm. Then, the polysilicon film formed on the first interlayer insulating film 46 is removed by the CMP method.

Accordingly, the polysilicon film being left in the bit-line contact hole 46a is used as the bit-line contact plug 48a, while the polysilicon film being left in the storage contact hole 46b is used as the storage electrode contact plug 48b.

Then, a second interlayer insulating film 49 of 90 nm thickness is formed on the plugs 48a, 48b and the first interlayer insulating film 46. It is preferable that the high temperature oxide film (SiO2 film), for example, should be used as the second interlayer insulating film 49.

In addition, windows 50a, 50b, 50c are formed on the bit-line plug 48a in the memory cell region A, one impurity diffusion layer 42 of the MOS transistor T12 in the peripheral circuit region B, and the wiring 40a formed on the device isolation insulating film 32 respectively, by coating photoresist 50 on the second interlayer insulating film 49 and then exposing/developing it.

Then, by etching the second interlayer insulating film 49 and then etching the first interlayer insulating film 46 and the protection insulating film 38 via these windows 50a to 50c, a bit-line contact via hole 49a is formed in the memory cell region A, a contact hole 49b is formed in the impurity diffusion layer 42 in the peripheral circuit region B, and a via hole 49c is formed in the first layer wiring 40a in the peripheral circuit region B.

Figure 14F:
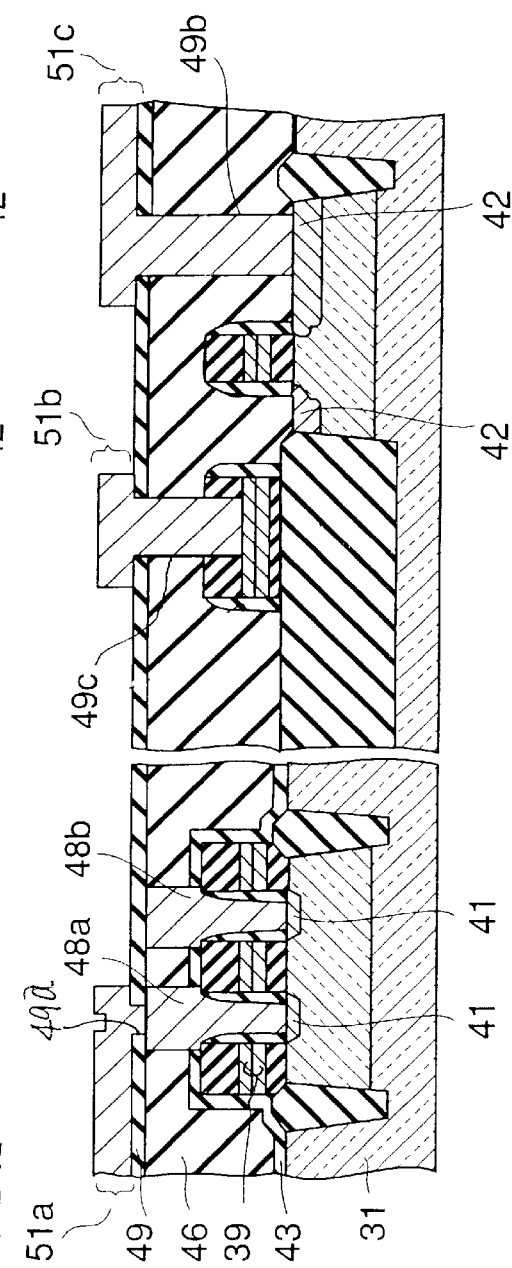

Then, the photoresist 50 is removed, then a Ti film of 40 nm thickness, a TiN film of 50 nm thickness, and a W film of 100 nm thickness are formed sequentially in the holes 49a to 49c and on the second interlayer insulating film 49 by the sputter method or the chemical vapor deposition method, and then these films are patterned by the photolithography method. According to the patterning of the metal film, as shown in FIG. 14F, a bit line 51a connected to the plug 48a via the via hole 49a is formed in the memory cell region A, and a second layer first wiring 51b connected to the first layer wiring 40a via the via hole 49c and a second layer second wiring 51c connected to the impurity diffusion layer 42 via the contact hole 49b are formed in the peripheral circuit region B. The second layer wirings 51b, 51c may be formed to constitute a part of the bit line, for example.

As described in the first embodiment, after metal plugs (not shown) are filled into the via hole 49a, the contact hole 49b, and the via hole 49c respectively, connection between the bit line 51a and the plug 48a, connection between the first layer wiring 40a and the first wiring 51b, and connection between the impurity diffusion layer 42 and the second wiring may be performed via the metal plugs respectively.

Figure 14G:
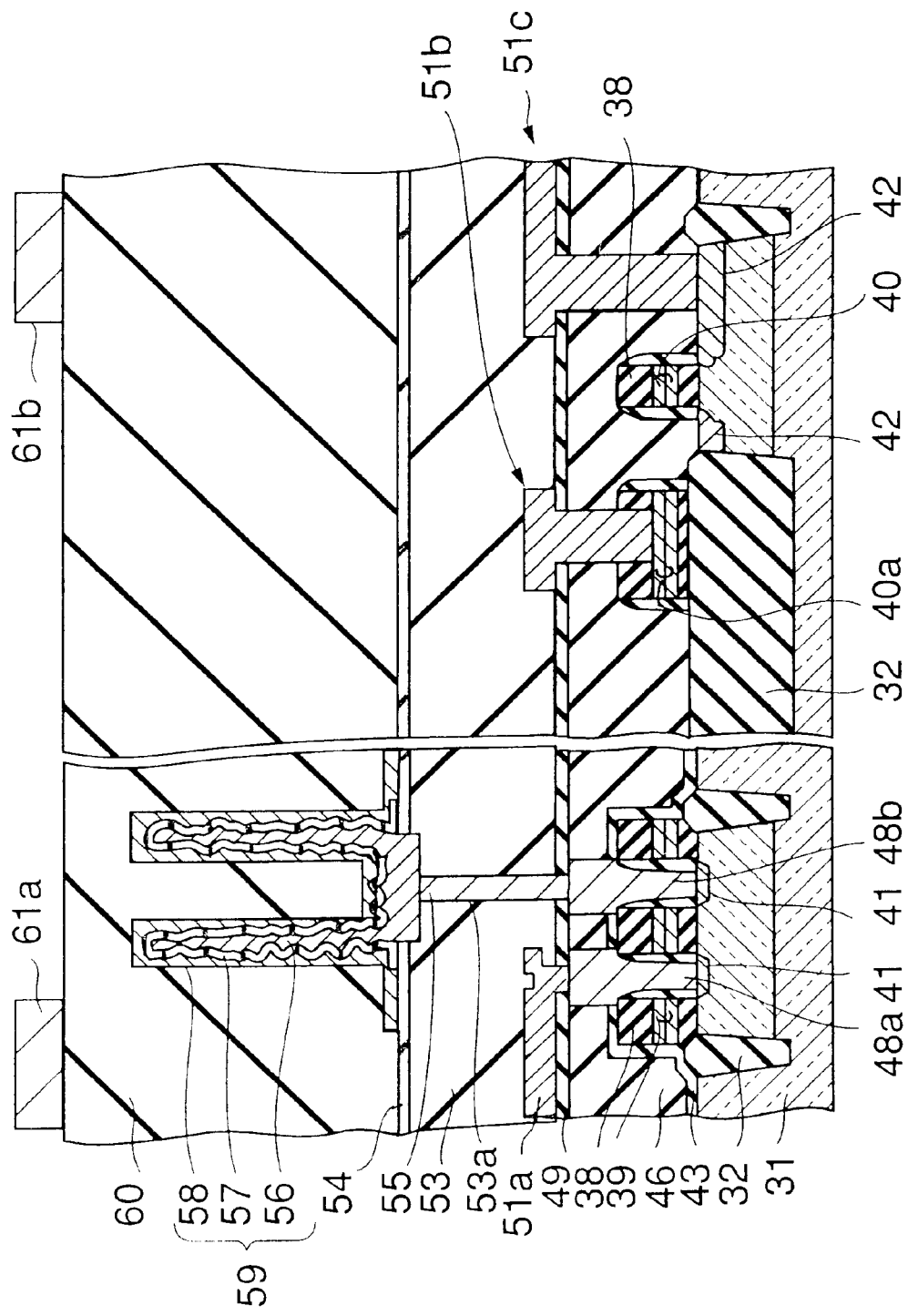

Then, steps required to get the structure shown in FIG. 14G will be explained hereunder.

First, a third interlayer insulating film 53 made of BPSG, $SiO_2$, etc. and having a thickness of 800 nm is formed on the bit line 51a in the memory cell region A and the second layer wirings 51b, 51c and the second interlayer insulating film 49 in the peripheral circuit region B by the chemical vapor deposition method. Then, a surface of the third interlayer insulating film 53 is planarized by the CMP method. Then, a silicon nitride film of 50 nm thickness is formed as a fourth interlayer insulating film 54 on the third interlayer insulating film 53.

Subsequently, the capacitor should be formed in the memory cell region A. Here, a dual-side cylinder-type capacitor employing tantalum oxide (TaO) as the dielectric film will be explained as an example.

First, a via hole 53a connected to the storage contact plug 48b in the memory cell region A is formed by patterning the third interlayer insulating film 53 and the fourth interlayer insulating film 54 by virtue of the photolithography method. Then, an impurity-containing polysilicon film of 200 nm thickness is formed in the via hole 53a and on the fourth interlayer insulating film 54 and then is removed from the upper surface of the fourth interlayer insulating film 54 by polishing this polysilicon film by means of the CMP method. Then, the polysilicon film left in the via hole 53a is used as a plug 55.

Then, an insulating film (not shown) made of $SiO_2$ or BPSG is formed on the fourth interlayer insulating film 54 and the plug 55 to have a thickness of 1.2 μm, and then a surface of the insulating film is planarized by the CMP method. In addition, an opening is formed in the capacitor region containing the plug 55 by patterning the insulating film, the fourth interlayer insulating film 54, and the upper layer portion of the third interlayer insulating film 53 by virtue of the photolithography method.

Then, an undoped or low impurity concentration amorphous silicon film is formed along the upper surface of the insulating film and the inner surface of the opening, and then a portion surrounded by the amorphous silicon film in the opening is buried by the resist. Then, the amorphous silicon film is removed from the upper surface of the insulating film by the CMP method. Accordingly, the amorphous silicon film being left in the opening is formed as a cylinder shape with a bottom.

Then, an inner peripheral surface and an outer peripheral surface of the cylindrical amorphous silicon film are exposed by removing the insulating film (not shown) on the fourth interlayer insulating film 54 by a hydrofluoric acid solution. Then, an HSG (Hemispherical Grained Silicon) film having an uneven surface is formed on the surface of the amorphous silicon film by heating the amorphous silicon film at 560° C., for example, in the low pressure atmosphere containing the silane gas and then annealing it at 560° C. after the pressure in the low pressure atmosphere is reduced. Then, the impurity is doped into the amorphous silicon film and the HSG film to reduce their resistances, and these films are used as a storage electrode 56.

After this, a dielectric film 57 made of tantalum oxide ($Ta_2O_5$) and having a thickness of 8 nm is formed on a surface of the storage electrode 56 by the chemical vapor deposition method. In order to improve the capacitor characteristics, the silicon storage electrode 56 is nitrided up to a depth of about 2 nm from the surface by the RTN (Rapid Thermal Nitriding) process before the formation of the dielectric film 57, and then the thermal oxidation process, the oxygen plasma annealing, or the like at about 800° C. is performed after the formation of the dielectric film 57.

Then, a titanium nitride film of 50 nm thickness and a doped polysilicon film of 100 nm thickness are formed in sequence on the dielectric film 57, and then these films are used as an opposing electrode 58 by patterning them.

With the above, the formation of the capacitor 59 is completed.

Then, an $SiO_2$ film of about 2.1 μm thickness is formed as a fifth interlayer insulating film 60 to cover the capacitor 59, and then a surface of the fifth interlayer insulating film 60 is planarized by the CMP method.

Next, contact holes (not shown) are formed in the bit line 51a and the opposing electrode 58 of the capacitor in the memory cell region A and a part of the second layer wirings 51b, 51c in the peripheral circuit region B, then plugs having a Ti/TiN/W triple-layered structure are filled into the contact holes, and then upper wirings 61a, 61b consisting of an aluminum or aluminum laminated structure connected to these plugs are formed on the fifth interlayer insulating film 60.

Figure 15A:
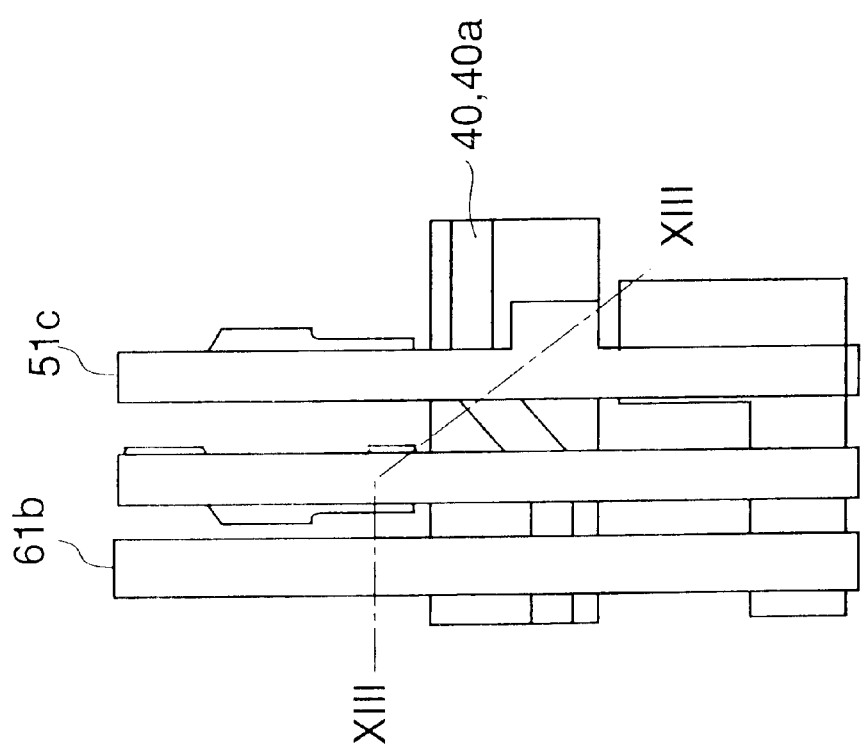
FIGS. 15A and 15B are plan views showing arrangement of respective elements of the semiconductor device shown in FIG. 14G.
Figure 15B:
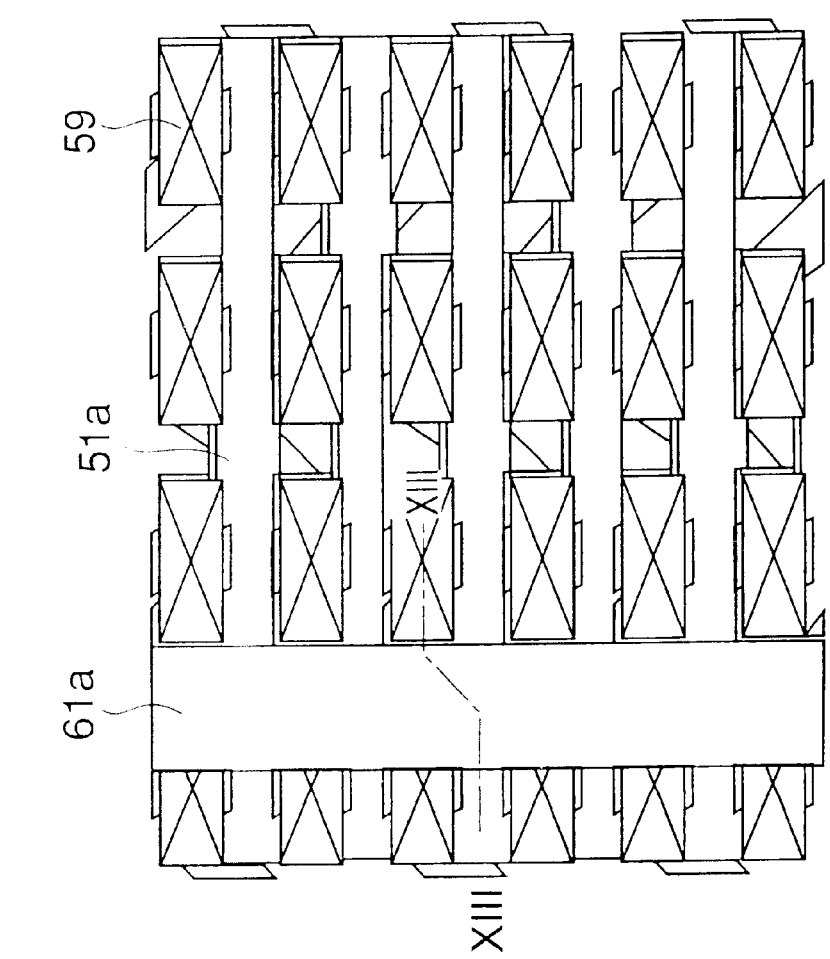

FIG. 14A to FIG. 14G show the sectional shape of the memory cell region A viewed along a XII—XII line in FIG. 15A and the sectional shape of the peripheral circuit region B viewed along a XIII—XIII line in FIG. 15B.

According to above steps, the silicon oxide film is formed as the protection insulating film 38 on the gate electrodes 39, 40 and the first layer wiring 40a, and then the silicon nitride film 43 covering the gate electrodes 39, 40 and the silicon substrate 31 is left as it is in the memory cell region A without the etching, but is etched to be left as the sidewalls 38s in the peripheral circuit region B.

Therefore, since the protection insulating film 38 on the electrode can be etched successively upon forming the hole by etching the second interlayer insulating film 49 and the first interlayer insulating film 46, the hole 49c for connecting the second layer wiring 51b and the first layer wiring 40a, the hole 49b connected to the impurity diffusion layer 42, and the hole 49a connected to the bit line plug can be formed simultaneously in the peripheral circuit region B, whereby throughput of the hole formation can be improved.

In addition, since connecting portions of the first layer wiring 40a and the second layer wiring 51b can be stacked, arrangement of the wirings can be designed freely. Furthermore, since there is no necessity to connect the first layer wiring 40a and the second layer wiring 51b by the upper wirings 61b unlike the prior art, the density of the upper wirings 61b can be increased. As a result, the increase of the chips can be prevented.

By the way, an example in which four type holes are opened simultaneously in the peripheral circuit region is set forth in Patent Application Publication (KOKAI) Hei 9-205185. According to this reference, the holes that bring the bit lines into contact with the silicon substrate are needed in the memory cell region. In this case, if it is tried to open simultaneously such holes and four type holes in the peripheral circuit region, the etching applied to form the bit line connection hole becomes difficult since the silicon nitride film is present on the silicon substrate in the memory cell region. Even if such etching can be applied, no alignment margin between the bit line connection hole and the gate electrodes is present. Thus, if the bit line connection hole and the gate electrodes are displaced, the silicon nitride film on the gate electrode is also etched, and in the worst case the gate electrodes are exposed. If the gate electrodes are exposed, the short circuit between the gate electrodes and the bit line occurs.

On the contrary, in the present invention, since the bit line and the silicon substrate are connected via the polysilicon plugs in the memory cell region, the hole etching can be performed in the situation that the silicon nitride film is not provided. Accordingly, as shown in FIG. 14C, the holes 49a, 49b, 49c can be formed simultaneously and easily in the peripheral circuit region and the memory cell region.

As described above, according to the present invention, the first insulating film is formed on the gate electrodes and the semiconductor substrate in the first region and the second region, the first insulating film is left as the sidewalls on the side surfaces of the gate electrodes by etching back it in the second region, the second insulating film formed of the same material as the first insulating film is formed in the first region and the second region, the third insulating film that can be etched selectively to the second insulating film is formed on the second insulating film, the first holes to expose the semiconductor substrate are formed by etching the first, second, and third insulating films between the gate electrodes in the first region, the impurity containing semiconductor plugs are formed in the first holes, the fourth insulating film to cover the plugs and the third insulating film is formed, the second holes are formed on the plugs by patterning the fourth insulating film in the first region and at the same time the third hole connected the impurity diffusion layer in the second region is formed by patterning the fourth insulating film to the second insulating film.

According to this, since the underlying first insulating film still remains even when the second hole is formed to protrude partially from the plugs in the first region, the semiconductor substrate is never exposed from the second hole because of the presence of the first insulating film. Thus, the metal film formed in the second hole can be prevented from contacting to the semiconductor substrate.

Also, according to another invention, in the case that the first holes that are formed in the underlying insulating film between the gate electrodes in the first region are formed to deviate to the gate electrodes on one side and the second hole that is formed in the overlying insulating film covering the plugs in the first holes is displaced from the first holes and has a depth reaching the impurity diffusion layer on the semiconductor substrate, the burying insulating film is formed selectively on the portions being projected from the plugs in the second hole.

According to this, the connection between the metal film formed in the second hole and the semiconductor substrate can be prevented by the burying insulating film.

Also, according to still another invention, there are provided steps of forming the first insulating film on the gate electrodes in the first region and the second region and on the first layer wiring in the second region respectively, forming the second insulating film on the gate electrodes, the first layer wiring and the semiconductor substrate, leaving the second insulating film on the side surfaces of the gate electrodes and the sides surfaces of the first layer wiring in the second region by etching back the second insulating film in the second region and also leaving the second insulating film in the entire first region, forming the third insulating film that can be etched under the same condition as the first insulating film in the first region and the second region respectively, forming the holes between the gate electrodes by patterning the third insulating film and the second insulating film in the first region, forming the plugs in the holes, and then forming the fourth insulating film on the plugs and the third insulating film.

According to this, the holes can be simultaneously formed on the plugs in the first region and on the gate electrodes and the first layer wiring in the second region respectively without change of the etchant by patterning the fourth insulating film and the underlying second and third insulating films. Therefore, throughput of the hole formation can be improved.

What is claimed is:

1. A semiconductor device comprising:

first gate electrodes formed on a first region of a semiconductor substrate via a first gate insulating film;

first impurity diffusion layers formed between the first gate electrodes and both sides of the first gate electrodes, in the semiconductor substrate;

a second gate electrode formed on a second region of the semiconductor substrate via a second gate insulating film;

second impurity diffusion layers formed on both sides of the second gate electrode in the semiconductor substrate;

a first insulating film for covering upper and side surfaces of the first gate electrodes and covering the semiconductor substrate in a region between the first gate electrodes;

sidewalls formed on side faces of the second gate electrode and made of same material as the first insulating film;

a second insulating film formed on the first insulating film in the first region and formed on the second gate electrode and the second impurity diffusion layers in the second region;

a third insulating film formed on the second insulating film and made of material different from the first insulating film and the second insulating film;

a first hole formed between the first gate electrodes and formed to have a depth reaching the first impurity diffusion layer via the first insulating film, the second insulating film, and the third insulating film;

a first plug formed of impurity containing semiconductor buried in the first hole;

a fourth insulating film formed on the first plug and the third insulating film;

a second hole formed in the fourth insulating film, and at least a part of the second hole is formed at a position to overlap with the first plug;

a third hole formed in the second, third and fourth insulating films in the second region to have a depth reaching one of the second impurity diffusion layers;

a first metal pattern passed through in the second hole and connected electrically to the first plug in the first hole; and a second metal pattern connected to one of the second impurity diffusion layers via the third hole.

2. A semiconductor device according to claim 1, wherein the first hole is formed between the first gate electrodes to deviate to the first gate electrodes on one side, a part of the second hole is formed to project from the first plug laterally and formed to have a depth reaching the third insulating film and the second insulating film, and contact of the first metal pattern passing through the second hole to the first impurity diffusion layer is cut off by the first insulating film.

3. A semiconductor device according to claim 1, wherein the first insulating film and the second insulating film are formed of a silicon nitride film.

4. A semiconductor device according to claim 1, wherein the third insulating film is formed of either a silicon oxide film or an impurity containing silicon oxide film.

5. A semiconductor device according to claim 1, wherein the first insulating film is thicker than the second insulating film.

6. A semiconductor device according to claim 1, wherein the first metal pattern and the second metal pattern are wirings formed on the fourth insulating film.

7. A semiconductor device according to claim 1, further comprising:
- a fourth hole formed in the first, second and third insulating films on the first impurity diffusion layer that are not connected to the first plug in the first region;
- a second plug formed of the impurity containing semiconductor buried in the fourth hole;
- a fifth insulating film formed on the fourth insulating film;
- a fifth hole formed in the third insulating film and the fourth insulating film on the second plug;
- a third plug formed in the fifth hole; and
- a capacitor including a capacitor lower electrode formed on the fifth insulating film to be connected to the third plug, a dielectric film formed on a surface of the lower electrode, and an upper electrode formed on the dielectric film.

8. A semiconductor device comprising:
- first gate electrodes formed on a first region of a semiconductor substrate via a first gate insulating film;
- a first impurity diffusion layer formed between the first gate electrodes and both sides of the gate electrodes, in the semiconductor substrate;
- a second gate electrode formed on a second region of the semiconductor substrate via a second gate insulating film;
- second impurity diffusion layers formed on both sides of the second gate electrode and in the semiconductor substrate;
- a first insulating film formed side surfaces of the first gate electrodes and the second gate electrode respectively;
- a second insulating film formed on the first gate electrodes, the second gate electrode, and the semiconductor substrate, and the second insulating film is made of the material different from the first insulating film;
- a first hole formed between the first gate electrodes at a position deviating to one of the first gate electrodes and formed in the first and second insulating films on the first impurity diffusion layer between the first gate electrodes;
- a plug formed of impurity containing semiconductor formed in the first hole;
- a third insulating film formed on the plug and the second insulating film;
- a second hole formed in the first, second and third insulating films in the first region, and a part of the second hole is formed at a position overlapping with the plug;
- a third hole formed in the first insulating film, the second insulating film, and the third insulating film on one of the second impurity diffusion layers;
- a fourth insulating film formed on bottom portion in the second hole;
- a first metal pattern connected to the plug via the second hole and disconnected from the first impurity diffusion layer by the fourth insulating film; and
- a second metal pattern connected to the second impurity diffusion layers via the third hole.

9. A semiconductor device comprising:
- first gate electrodes formed on a first region of a semiconductor substrate via a first gate insulating film;
- a second gate electrode formed on a second region of the semiconductor substrate via a second gate insulating film;
- a first wiring formed on the second region of the semiconductor substrate;
- a first insulating film formed on the first gate electrodes, the second gate electrode, and the first wiring;
- first impurity diffusion layers formed between the first gate electrodes and both sides of the first gate electrodes in the semiconductor substrate;
- second impurity diffusion layers formed in both sides of the second gate electrode in the semiconductor substrate;
- a second insulating film formed on the first gate electrodes, the first insulating film, and the first impurity diffusion layers in the first region and formed of material different from that of the first insulating film;
- sidewalls formed on side surfaces of the second gate electrode and the first wiring in the second region and made of same material as the second insulating film;
- a third insulating film formed on the second insulating film in the first region, formed on the first insulating film, the sidewalls, and the second impurity diffusion layers in the second region, and made of material that can be etched under same conditions as the first insulating film;
- a first hole formed in the second and the third insulating films on the first impurity diffusion layer formed between the first gate electrodes;
- a conductive plug formed in the first hole;
- a fourth insulating film formed on the conductive plugs and the third insulating film;
- a second hole formed in the fourth insulating film on the conductive plug in the first region;
- a third hole formed in the first, third, and fourth insulating films in the second region to expose a part of the first wiring; and
- a fourth hole formed in the third and fourth insulating films in the second region to expose one of the second impurity diffusion layer.

10. A semiconductor device according to claim 9, further comprising:
- a first conductive pattern formed on the fourth insulating film and connected to the conductive plug via the second hole;

a second conductive pattern formed on the fourth insulating film and connected to the first wiring via the third hole; and a third conductive pattern formed on the fourth insulating film and connected to the second impurity diffusion layer via the fourth hole.

11. A semiconductor device according to claim 10, wherein the first wiring has a structure that is extended from the second gate electrode.

12. A semiconductor device according to claim 10, wherein the first insulating film is formed of a silicon oxide film, the second insulating film is formed of a silicon nitride film, the third insulating film is formed of any one of the silicon oxide film and an impurity containing silicon oxide film, and the fourth insulating film is formed of one of the silicon oxide film and the impurity containing silicon oxide film.

13. A semiconductor device according to claim 10, wherein the first region is a memory cell region, the second region is a peripheral circuit region, and the first conductive pattern, is bit line.

* * * * *